(12) United States Patent
Mazor et al.

(10) Patent No.: US 11,329,732 B1
(45) Date of Patent: May 10, 2022

(54) SYSTEMS AND METHODS FOR IMPROVING RADIO FREQUENCY INTEGRATED CIRCUITS

(71) Applicant: VAYYAR IMAGING LTD., Yehid (IL)

(72) Inventors: Nadav Mazor, Ramat Gan (IL); Jan Oredsson, Solna (SE); Naftali Chayat, Kfar Saba (IL)

(*) Notice: Subject to any disclaimer, the term of this patent is extended or adjusted under 35 U.S.C. 154(b) by 0 days.

(21) Appl. No.: 17/606,775

(22) PCT Filed: Oct. 23, 2020

(86) PCT No.: PCT/IB2020/059963
§ 371 (c)(1),
(2) Date: Oct. 27, 2021

(87) PCT Pub. No.: WO2021/076325
PCT Pub. Date: Apr. 29, 2021

Related U.S. Application Data

(60) Provisional application No. 63/011,374, filed on Apr. 17, 2020, provisional application No. 62/948,332, filed on Dec. 16, 2019, provisional application No. 62/924,713, filed on Oct. 23, 2019, provisional application No. 62/924,715, filed on Oct. 23, 2019.

(51) Int. Cl.
| | | |
|---|---|---|
| *H04B 15/04* | (2006.01) | |
| *H04B 1/16* | (2006.01) | |
| *H04B 1/18* | (2006.01) | |
| *H04B 1/04* | (2006.01) | |
| *H04B 1/40* | (2015.01) | |

(52) U.S. Cl.
CPC .......... *H04B 15/04* (2013.01); *H04B 1/0475* (2013.01); *H04B 1/1607* (2013.01); *H04B 1/18* (2013.01)

(58) Field of Classification Search
CPC ...... H04B 1/0475; H04B 1/16; H04B 1/1607; H04B 1/18; H04B 1/38; H04B 1/40; H04B 15/00; H04B 15/04; H04B 15/06; H03B 15/02
See application file for complete search history.

(56) References Cited

U.S. PATENT DOCUMENTS

| | | | |
|---|---|---|---|
| 6,111,742 A | 8/2000 | Bonhoure et al. | |
| 6,903,946 B1 | 6/2005 | Wu | |
| 8,041,294 B2 * | 10/2011 | Rofougaran | H04B 1/40 455/333 |

(Continued)

FOREIGN PATENT DOCUMENTS

EP      3176947 B1      7/2019

*Primary Examiner* — Quochien B Vuong
(74) *Attorney, Agent, or Firm* — Alphapatent Associates, Ltd; Daniel J. Swirsky

(57) ABSTRACT

Systems and methods for improving radio frequency integrated circuits. Extended conducting plates having current forming elements are used to equalize return currents from an array of capacitance banks in radio frequency integrated circuits and to reduce crosstalk between crossing signal lines by providing isolation mechanisms for use as a shield between the signal carrying lines. Material encapsulated magneto-electric antennas are configured into antenna arrays on a PCB or a RFIC package. Antenna arrays may comprise antennas having different directivity levels and may have asymmetric arrangement of antenna elements.

4 Claims, 17 Drawing Sheets

(56) References Cited

U.S. PATENT DOCUMENTS

| | | |
|---|---|---|
| 9,444,511 B2 * | 9/2016 | Suh .................... H04B 1/0458 |
| 9,496,902 B2 * | 11/2016 | Srirattana ................ H04B 1/40 |
| 10,679,823 B2 * | 6/2020 | Mavretic .................. H04B 1/44 |
| 10,951,202 B2 * | 3/2021 | Cheng .................... H04B 1/16 |
| 2009/0079524 A1 | 3/2009 | Cyr et al. |
| 2012/0105167 A1 | 5/2012 | Min et al. |
| 2014/0077300 A1 | 3/2014 | Noel et al. |
| 2018/0145438 A1 | 5/2018 | Cohen |

* cited by examiner

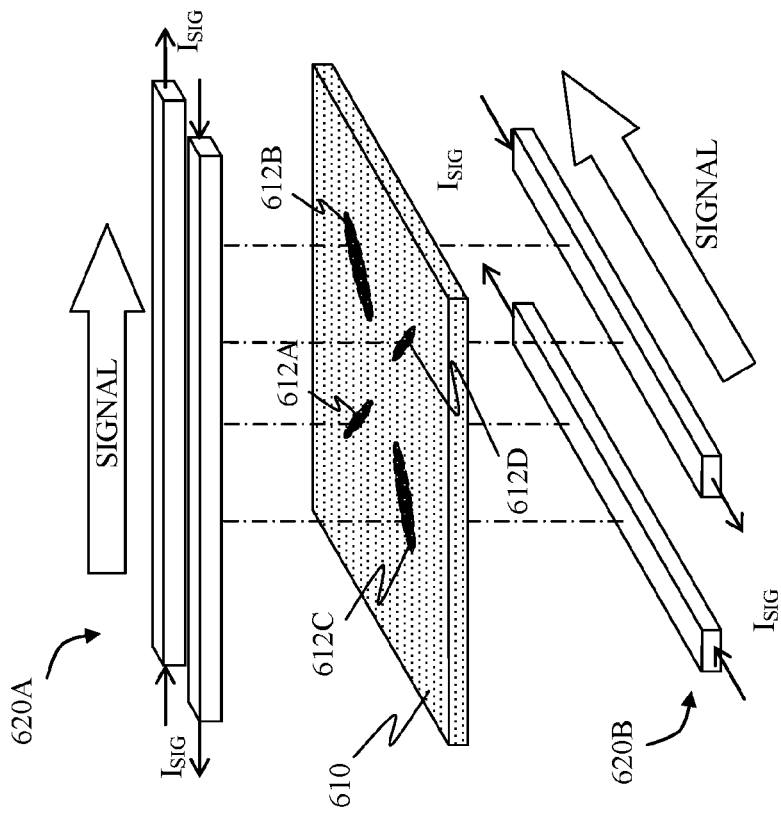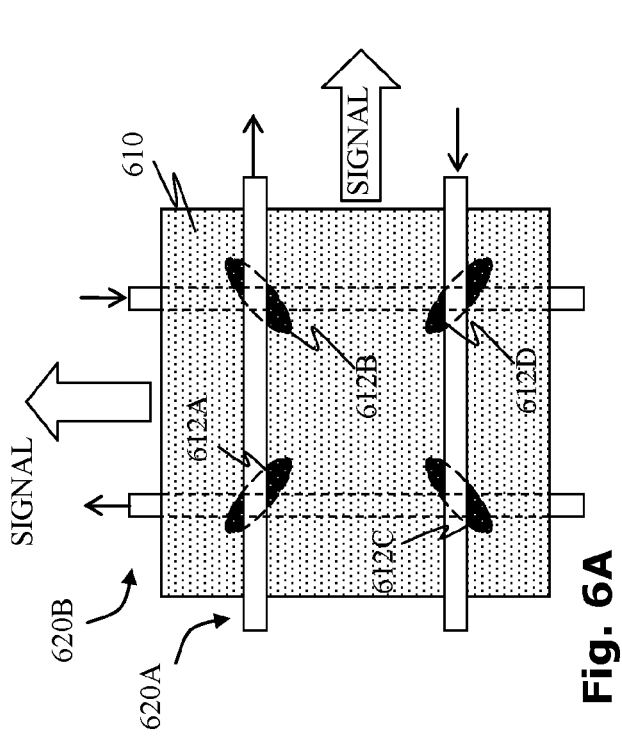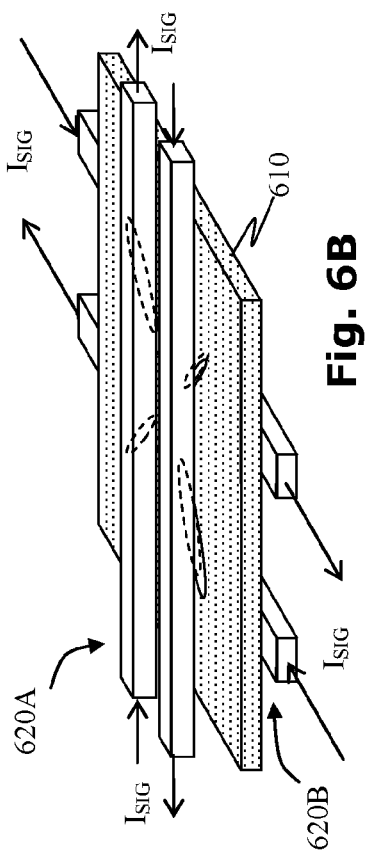
Fig. 6A
Fig. 6B
Fig. 6C

SYSTEMS AND METHODS FOR IMPROVING RADIO FREQUENCY INTEGRATED CIRCUITS

CROSS-REFERENCE TO RELATED APPLICATIONS

This application is a U.S. National Phase Application under 35 U.S.C. 371 of International Application No. PCT/IB2020/059963, which has an international filing date of Oct. 23, 2020, which claims the benefit of priority from U.S. Provisional Patent Application No. 62/924,713, filed Oct. 23, 2019, U.S. Provisional Patent Application No. 62/924,715, filed Oct. 23, 2019, U.S. Provisional Patent Application No. 62/948,332, filed Dec. 16, 2019 and U.S. Provisional Patent Application No. 63/011,374, filed Apr. 17, 2020 the contents of which are incorporated by reference in their entirety.

FIELD OF THE DISCLOSURE

The disclosure herein relates to systems and methods for improving radio frequency integrated circuits (RFICs), particularly RFICs for supporting multichannel transceivers, with emphasis on phased array and MIMO systems. In particular, but not exclusively, the disclosure relates to improvements in signal generation techniques and signal distributon techniques. The improved signal generation takes advantage of ground planes in the the equalizing return currents from array branches in a capacitor bank, for example in voltage control oscillator (VCO) circuits. Improved signal distribution allows reducing crosstalk between crossing signal lines by modified shielding between the signal carrying lines. The disclosure further relates to the implementation of magneto-electric antennas embedded into or mounted onto a printed circuit board (PCB), and corresponding antenna arrays. In a particular embodiment, magneto-electric antennas and corresponding arrays are embedded into a RFIC package.

BACKGROUND

Modern multichannel transceiver RFICs find numerous applications in antenna array based systems, such as phased array or MIMO systems. Examples of such systems are communications systems or radar sensor systems. Modern systems, such as 5G, WLAN or MIMO radar systems, may have tens of radio channels or even more. Generation of multiple radio signals and distributing them on-chip while maintaining high signal integrity poses significant challenges. For example, generation of high-purity signals requires high-quality voltage controlled oscillators. Distribution of both transmitted signals and receive local oscillator signals to multiple transceivers poses a risk of signal contamination through leakage at the crossings of signal distribution lines. Effective radiation of signals from the RFICs require efficient antennas, which are preferable located on or in proximity to the RFIC, such as in the package of the RFIC.

The dimensions of radio frequency integrated circuits (RFIC) often give rise to a disparity between the required and actual response of electronic circuits. For example, where a capacitor bank is expected to provide selectable known capacitance it has been found that when the physical dimensions of the capacitor bank is a fraction of the signal wavelength, electronic coupling within a capacitor bank may produce significant deviation from required capacitance of each switched capacitor array branch of the capacitor bank.

Various methods may be used to counter signal dependent deviation within the capacitor bank. For example, the connecting components between the functional circuit and the capacitance bank may be particularly thick, constructed from high conductivity materials or otherwise selected so as to lower the overall inductance and resistance to all the capacitors. However this has been found to result in non-linear characteristics of capacitance dependency on branch switching. In an application example of a capacitor bank in a voltage controlled oscillator (VCO), this results in non-linear or even non-monotonous dependency of frequency on branch switching.

Another method may be to use adjusted capacitance values in the capacitor bank such that the capacitance of each array branch is corrected to compensate for its distance from the terminals of the functional circuit. In practice however, in such unbalanced capacitor bank the uniformity of capacitance steps is compromised and they are very difficult to tune.

It is further important to electronically isolate crossing signals to avoid crosstalk therebetween. Isolation is particularly hard to achieve on a printed circuit board or integrated circuit chip where the physical dimensions are limited and where leakage may limit system performance.

One way in which crosstalk may be reduced is to introduce an extended conducting plate to serve as a ground shield between the crossing signal lines. However, where the conducting plate is not actually grounded, it has surprisingly been found that charge may flow within or around the conducting material of the ground shield to some extent. As a result crosstalk may still occur even where the ungrounded conductor is introduced as a shield.

The need remains, therefore, for a circuit which enabling a large capacitor bank in a functional circuit without compromising step uniformity or linearity as well as for an improved isolation mechanism for use in an ungrounded chip. The invention described herein addresses the above-described needs.

It is also noted that PCB based antennas, such as Surface Mount Technology (SMT) dipole antennas may be manu-factured by printing copper radiating elements upon a glass epoxy substrate. Such antennas may be used to transmit or receive electromagnetic radiation within a certain bandwidth. The antenna bandwidth is limited by the physical dimensions of the radiating elements, which is generally around a half wavelength.

The idea of combining an electric dipole with a magnetic dipole to obtain a symmetric radiation pattern (in E-plane and in H-plane) was proposed in the 1960's with the original aim of providing efficient illumination of dish antennas. To achieve this effect, the electric and magnetic dipoles were displaced along the axis of radiation. More recently, the idea was applied to antennas above a ground plane, where the directivity and bandwidth of the radiation may be improved by combining an electric dipole with a magnetic dipole to produce a complementary wideband antenna, for example, U.S. Pat. No. 7,843,389 to Kwi-Man Luk and Hang Wong, titled, "Complementary wideband antenna" describes a complementary wideband antenna which includes a planar dipole formed of two dipole wing sections and a shorted patch antenna located between the dipole wing sections. The dipole sections of the planar dipole are spaced above a ground plane. A feed probe is used to excite the antenna.

Such complementary wideband antenna may show low back radiation and a stable gain and radiation pattern shape over a wide frequency bandwidth.

However, the transmission frequency of such complementary wideband antennas is highly dependent on the physical dimensions of the antenna elements themselves. For example, for a transmission wavelength of $\lambda$, the length of each of the dipole element is approximately $0.25\lambda$ and these are separated by a gap of approximately $0.1\lambda$ so as to form the patch antenna therebetween. Accordingly, the tip-to-tip length of the antenna is approximately $0.6\lambda$. In the orthogonal orientations, both the width of the antenna and its height from the ground plane are approximately $0.25\lambda$.

Accordingly, to transmit radiation at, say, 5 GHz (which has a wavelength of about 6 cm in free space) would require dimensions of about 30 mm×30 mm×40 mm. Such large antennas may be impractical in a wideband array configuration, that requires an element to element spacing of half wave length at the highest frequency. Therefore, if a single antenna is capable to operate at 5-10 GHz range, the requirement would be to space them 15 mm apart (15 mm=half wavelength at 10 GHz).

The need remains, therefore, for a wideband unidirectional compact antennas with small enough dimensions. The invention described herein addresses this need.

SUMMARY OF THE EMBODIMENTS

According to one aspect of the presently disclosed subject matter, a method is hereby taught for improving multichannel RF transceiver chips by providing a radio frequency integrated circuits with a modified current forming ground plane. A radio frequency integrated circuit may include at least two crossing signal lines; a signal isolation mechanism for reducing crosstalk between the at least two crossing signal lines; at least one array of switched capacitors comprising a plurality of capacitors arranged into a plurality of capacitor array branches, each capacitor array branch having a characteristic capacitance; and a plurality of electronic switches for selectively connecting each capacitor array branch to a common functional circuit terminal junction. The capacitor array branch may be conductively coupled to an extended conducting ground plane.

Typically, at least one of the signal isolation mechanism or the extended conducting ground plane comprises an extended conducting plate, and at least one current forming element located so as to limit current therethrough. Variously, the current forming element may be selected from a group consisting of: at least one hole through the ground plane element, a semiconducting material embedded into the ground plane element, an insulating material embedded in the ground plane element, a region of varied thickness of ground plane element, and the like as well as combinations thereof.

According to aspects of the disclosure, an array of switched capacitors is presented comprising: a plurality of capacitors upon a substrate, the capacitors arranged into a plurality of capacitor array branches, each capacitor array branch having a characteristic capacitance; and a plurality of electronic switches for selectively connecting each capacitor array branch to a common functional circuit terminal junction. Variously, the functional circuit may comprises a voltage controlled oscillator (VCO), a phase shifter, a tuning circuit, or the like.

Where appropriate, each capacitor array branch may be conductively coupled to an extended conducting ground plane. Optionally, the plurality of electronic switches comprise small size array FET switches having gate-source voltages driven by extended voltage range.

Variously, the ground plane may be a biased to the drain supply voltage (VDD or to the source supply voltage (VSS). Where required, the ground plane may be connected to a bias voltage via a bias terminal located at its center, optionally, via a noise reduction mechanism, such as a choke component.

The ground plane may include at least one current limiting element located such that return current from each the capacitor array branch to the functional circuit terminal junction is equalized. Variously, the current forming element may be selected from a group consisting of: at least one hole through the ground plane element, a semiconducting material embedded into the ground plane element, an insulating material embedded in the ground plane element, a region of varied thickness of ground plane element, and the like as well as combinations thereof.

In other aspects of the disclosure, a signal isolation mechanism is introduced for reducing crosstalk between at least two crossing signal lines. The mechanism may include: a ground shield comprising at least one extended conducting plate having a first side and a second side; a first signal line running parallel to the first side of the ground shield in a first direction; a second signal line running parallel to the second side of the ground shield in a second direction not parallel to the first direction such that the second signal line passes across the first signal line. Accordingly, the ground shield may include at least one current forming element selected such that inductive coupling generated between the first signal line and the second signal line cancels capacitive coupling therebetween.

Optionally, the at least one current forming element may comprise at least one through hole extending from the first side to the second side of the ground shield. Such a hole may be located along a line extending from the first signal line to the second signal line at the point at which they cross. Additionally or alternatively, the through hole may be shaped such that inductive coupling is generated between the first signal line and the second signal line and that the inductive coupling cancels capacitive coupling therebetween. Optionally, the through hole may be diagonally elongated at an angle to both the first signal line and the second signal line.

Variously, the first signal line comprises a first differential pair of conductors and the second signal line comprises a second differential pair of conductors. Accordingly, the ground shield may comprise: at least a first through hole located along a line extending from a first line of the first differential pair to a first line of the second differential pair at the point at which they cross; at least a second through hole located along a line extending from a second line of the first differential pair to a first line of the second differential pair at the point at which they cross; at least a third through hole located along a line extending from a first line of the first differential pair to a second line of the second differential pair at the point at which they cross; and at least a fourth through hole located along a line extending from a second line of the first differential pair to a second line of the second differential pair at the point at which they cross.

Where required, the first through hole is diagonally elongated at a first angle across both the first line of the first differential pair and a first line of the second differential pair; the second through hole is diagonally elongated at a second angle second line of the first differential pair and a first line of the second differential pair; the third through hole is diagonally elongated at the second angle; and the second through hole is diagonally elongated at the first angle.

BRIEF DESCRIPTION OF THE FIGURES

For a better understanding of the embodiments and to show how it may be carried into effect, reference will now be made, purely by way of example, to the accompanying drawings.

With specific reference now to the drawings in detail, it is stressed that the particulars shown are by way of example and for purposes of illustrative discussion of selected embodiments only, and are presented in the cause of providing what is believed to be the most useful and readily understood description of the principles and conceptual aspects. In this regard, no attempt is made to show structural details in more detail than is necessary for a fundamental understanding; the description taken with the drawings making apparent to those skilled in the art how the various selected embodiments may be put into practice. In the accompanying drawings:

FIG. 6A is a top view schematically representing an isolation mechanism introduced between two crossing differential signal lines according to the current disclosure;

FIG. 6B is an isometric view schematically representing an isolation mechanism introduced between two crossing differential signal lines according to the current disclosure;

FIG. 6C is an exploded isometric view schematically representing an isolation mechanism introduced between two crossing differential signal lines according to the current disclosure;

FIGS. 12A and 4B are graphs illustrating simulated values showing how gain of the encapsulated magneto-electric dipole antenna of FIG. 11 varies over spatial angle and frequency;

FIGS. 13A and 5B are graphs illustrating how the simulated results for the encapsulated magneto-electric dipole antenna of FIG. 11 compare to experimental results for a real encapsulated magneto-electric dipole antenna;

DETAILED DESCRIPTION

Figure 1:
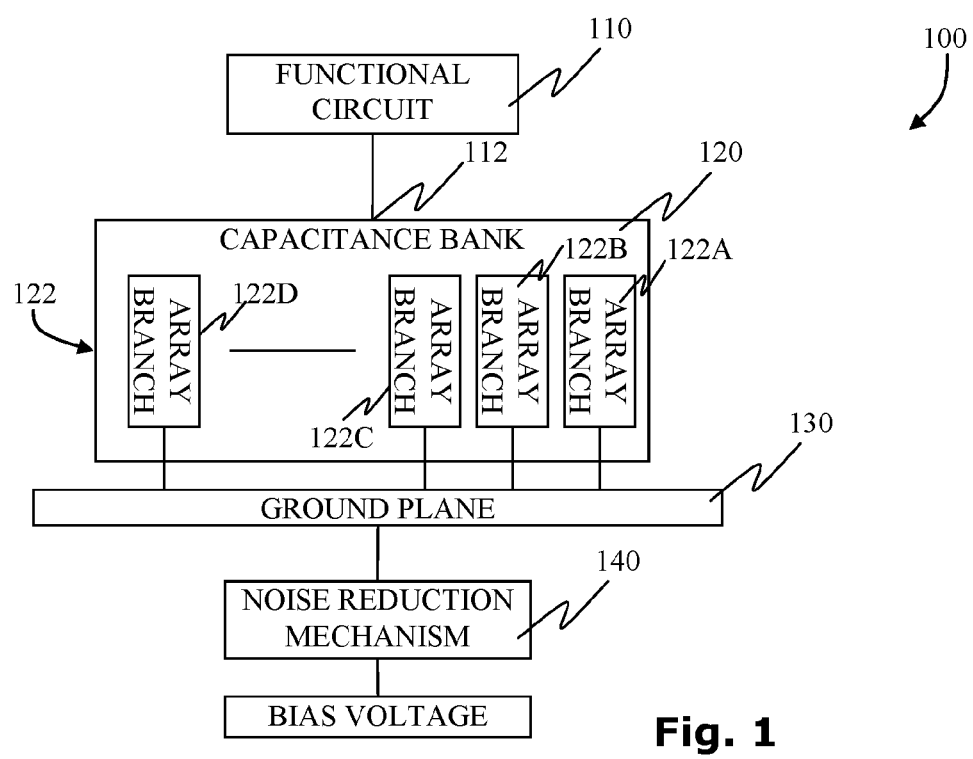
FIG. 1 is a block diagram indicating selected elements of an electronic system including a functional circuit connected to an array of switched capacitors according to the current disclosure.

Aspects of the present disclosure relate to system and methods for improving RFIC chips. Systems and methods are described for providing capacitance banks in radio frequency integrated circuits which use a ground plane to equalize return currents from array branches in a capacitor bank. Systems and methods are described for reducing crosstalk between crossing signal lines by providing isolation mechanisms for use as a modified shield between the signal carrying lines.

Further systems and methods improve PCB mounted antenna arrays for example by providing MIMO antenna-arrays combining antennas having directivity-levels and where appropriate providing material encapsulated magneto-electric antennas. Particularly, the antennas may be integrated with the RFIC or within its package.

In various embodiments of the disclosure, one or more tasks as described herein may be performed by a data processor, such as a computing platform or distributed computing system for executing a plurality of instructions. Optionally, the data processor includes or accesses a volatile memory for storing instructions, data or the like. Additionally, or alternatively, the data processor may access a non-volatile storage, for example, a magnetic hard-disk, flash-drive, removable media or the like, for storing instructions and/or data.

It is particularly noted that the systems and methods of the disclosure herein may not be limited in its application to the details of construction and the arrangement of the components or methods set forth in the description or illustrated in the drawings and examples. The systems and methods of the disclosure may be capable of other embodiments, or of being practiced and carried out in various ways and technologies.

Alternative methods and materials similar or equivalent to those described herein may be used in the practice or testing of embodiments of the disclosure. Nevertheless, particular methods and materials are described herein for illustrative purposes only. The materials, methods, and examples are not intended to be necessarily limiting.

Aspects of the present disclosure relate to systems and methods for providing capacitor banks in radio frequency integrated circuits.

By way of example only, one circuit affected by difficulties in connecting switched capacitor arrays uniformly, is the frequency tuning capacitor bank of a voltage controlled oscillator (VCO) circuit. Where the bank is of a large enough physical size that the array branches of the order of magnitude of the signal wavelength, the capacitor bank can develop non-linear characteristics of capacitance dependency on branch switching.

This may occur when the each array branch of individual switched capacitor array elements are connected with unequal impedance to the VCO main inductor at different junction points. It has been found that such systems may develop non-linear frequency switching or even non-monotonic behavior.

It has been surprisingly found that such non-linear and non-monotonic behavior are an acute problem, for example, large-array differential switched capacitor circuits, when capacitance control algorithms perform actions which have unexpected outcomes. These drawbacks have necessitated creative solutions.

It is therefore suggested that by adding a virtual ground plane to act as the return path between the two differentially arranged large-array switched capacitor banks. Accordingly, the array may be laid out such that the capacitor side terminals of each of the array branches of switched capacitor array elements in each capacitor bank may be connected to a common connection point.

Various features of the virtual ground plane architecture are discussed herein below such as biasing the ground plane to either the source or drain voltages of the so as to allow small size array FET switches to be used due to an extended voltage range driving the FET gate-source voltages.

Further the bias terminal may be located at the geometric center of the ground plane, possibly through a choke component, to improve common-mode ground noise rejection or injection.

Moreover, the ground plane itself may be used as a current shaping device, perhaps by cutting holes or slots within the metal (cheesing) in such as manner so as to equalize the return path from each switched array branch to the functional circuit terminals.

As required, detailed embodiments of the present invention are disclosed herein; however, it is to be understood that the disclosed embodiments are merely examples of the invention that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present invention.

Reference is now made to the block diagram of FIG. 1 which indicates selected elements of an electronic system 100 including a functional circuit 110 connected to an array of switched capacitors 122 according to the current disclosure.

The electronic system 100 may include the functional circuit 110, a capacitance bank 120, a ground plane 130, a noise reduction mechanism 140 and a bias voltage terminal 150. It is particularly noted that the array of switched capacitors 120 is connected to the functional circuit at a single terminal 112 whereas each array branch 122A-D of the capacitance bank 120 is individually connected to the ground plane 130.

The capacitance bank 120 may be a plurality of capacitors mounted upon a substrate. The capacitors may be arranged into a plurality of capacitor array branches 122A-D having a characteristic capacitance. One end of each capacitor array branch 122A-D may be connected to a common function circuit terminal 110. The other end of each capacitor array branch 122A-D may be connected to the ground plane 130 at separate connection points.

Where required, a plurality of electronic switches may be provided for selectively connecting each capacitor array branch to the ground plane. Additionally or alternatively, the plurality of electronic switches may be provided for selectively connecting each capacitor array branch to the common functional circuit terminal junction.

Figure 2B:
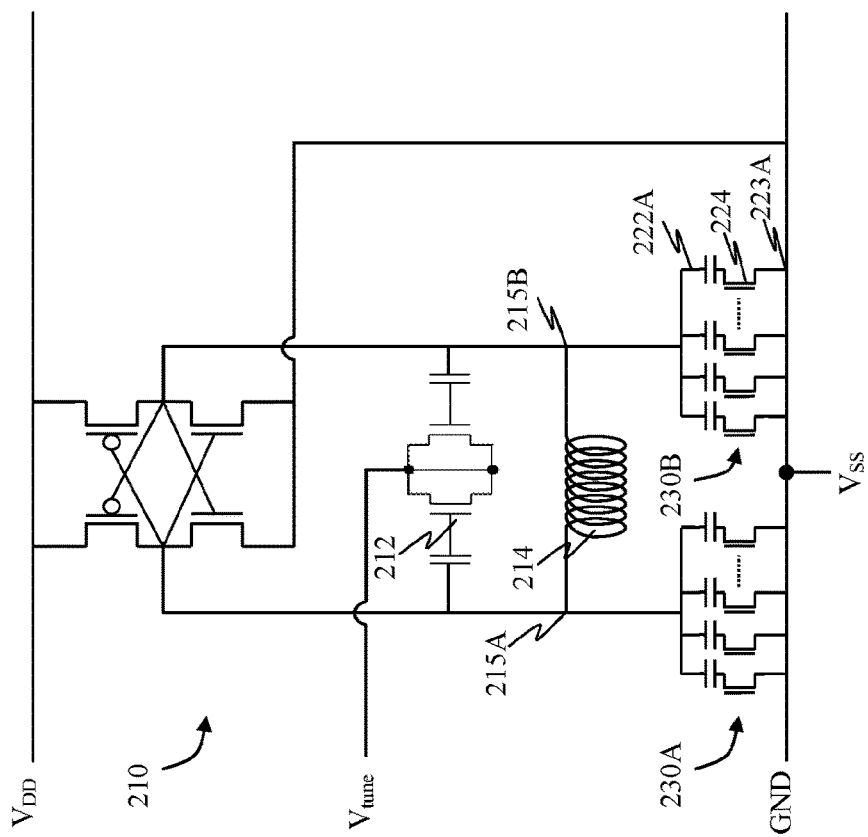
FIG. 2B is a suggested schematic circuit diagram indicating how two arrays of switched capacitors connected to a common ground line may be incorporated into a functional circuit.
Figure 2A:
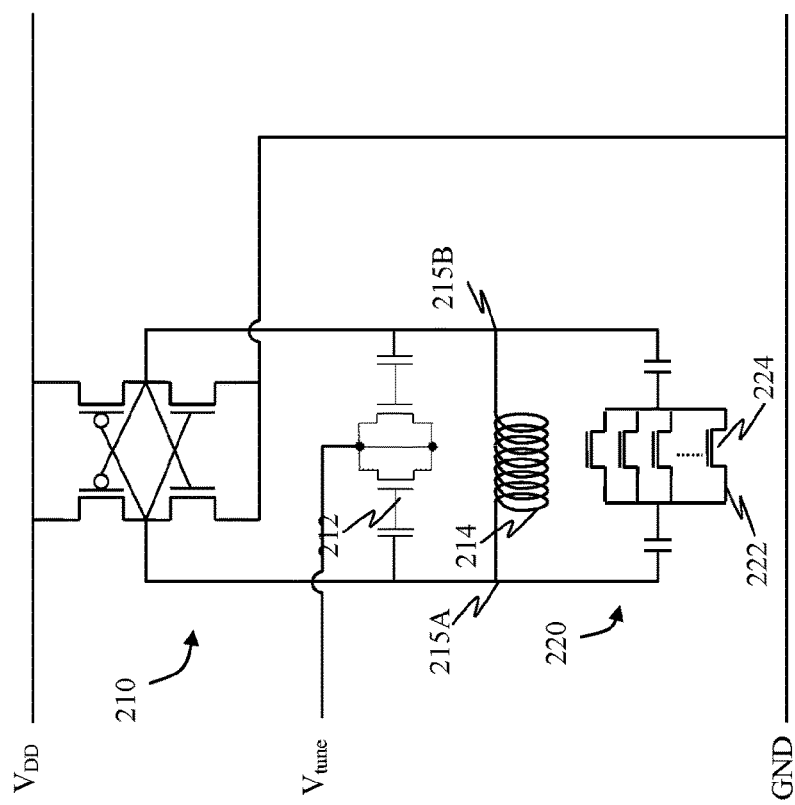
FIG. 2A is a schematic circuit diagram indicating a particular functional circuit configured as a voltage controlled oscillator including a coarse tuning using a switched capacitor bank and a fine tuning based upon voltage controlled capacitor (varicap)

Referring now to the schematic circuit diagram of FIG. 2A, an example of a particular functional circuit 210 is shown which is configured as a voltage controlled oscillator (VCO). The VCO circuit includes a fine tuning circuit 212 and an inductor element 214. The capacitor bank 220, which may be used for coarse tuning, is connected between the terminals 215A, 215B of the inductor 214.

The capacitor bank 220 includes a plurality of array branches 222 each having a different known capacitance each array branch is connected to the ground plane via a corresponding electronic switch 224. Required capacitance is selected by switching required the branches such that the overall sum of the capacitance bank is equal to the sum of the individual capacitances of all the selected branches. In some implementations, the capacitance of each array branch is a multiple of a power of two such that, where there are N array branches in the bank, 2N discrete values of capacitance may be selected.

As noted herein, in order for the required value of capacitance to have any linearity, the capacitance of each branch must be controlled. However where the physical size of the branches is a significant fraction of the signal wavelength, electronic coupling within a capacitor bank may produce significant deviation from required capacitance to a differing degree for each switched capacitor array branch.

Reference is now made to the schematic circuit diagram of FIG. 2B which indicates how two arrays 230A, 230B of switched capacitors of the disclosure may be incorporated into a similar VCO functional circuit.

It is noted that the VCO circuit is used for illustrative purposes. It will occur to those skilled in the art that balanced capacitance banks of the disclosure may be used with a variety of functional circuits such as, but not limited to phase shifters, filters, tuning circuits and the like.

The system includes a first capacitance bank 230A connected to a first terminal 215A of the functional circuit 210 and a second capacitance bank 230B connected to a second terminal 215B of the functional circuit 210. It is a particular feature of the system that each array branch 222A of the capacitance bank is connected to a common ground line GND at a separate junction point 223A. Accordingly, the return current path for each branch is different for each branch. Consequently, the capacitance of each branch may be controlled.

Furthermore, the ground line itself may be biased to a known voltage, such as the true ground, the source supply voltage (VSS), the drain supply voltage (VDD) or the like as suits requirements.

It will be appreciated that such as bias may extend the voltage range driving the FET gate-source voltages. This in turn may allow FET switches of smaller size to be used in the array branches.

Figure 3:
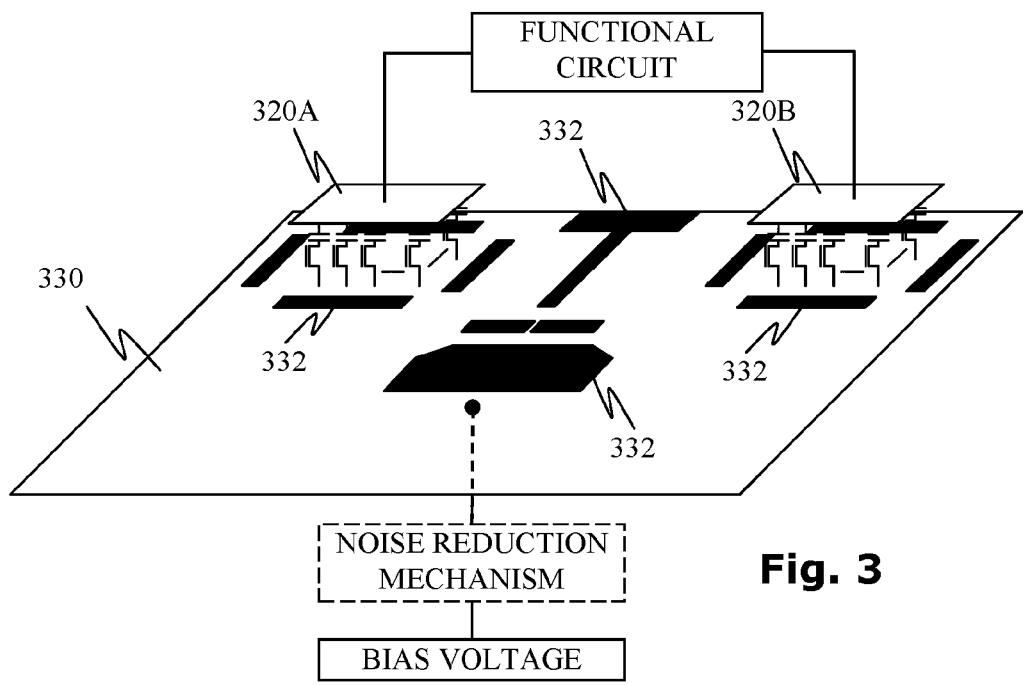
FIG. 3 is an isometric representation schematically indicating a current shaping ground plane used for equalizing return path current from each array branch of the capacitance bank.

With reference now to FIG. 3, which shows an isometric representation of an extended ground plane 330, current shaping elements 332 may be introduced into the ground plane 330 for equalizing return path current from each array branch 320A, 320B of the capacitance bank.

Current shaping zones 332 may be used to produce a ground plane with a required conductivity map such that the path from each array branch has a required reactance. The reactance may be selected so as to counteract the deviations from required capacitance for each array branch.

Figure 4A:
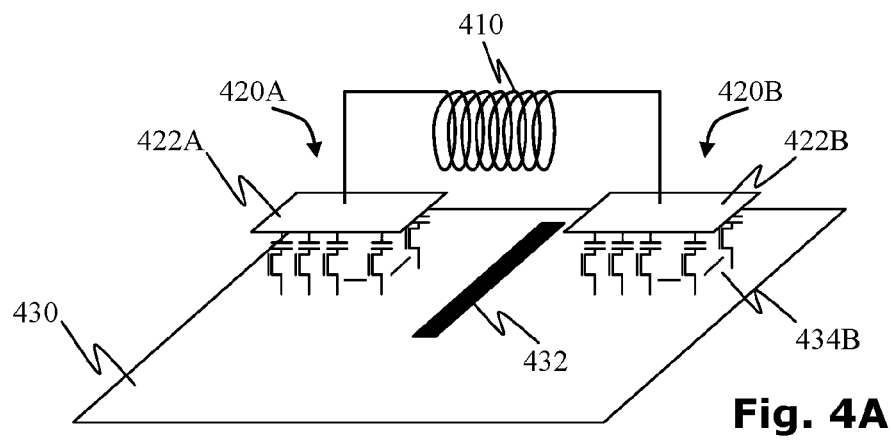
FIGS. 4A and 4B are an isometric representation and top view, respectively schematically representing a particular example of the current shaping ground plane.
Figure 4B:
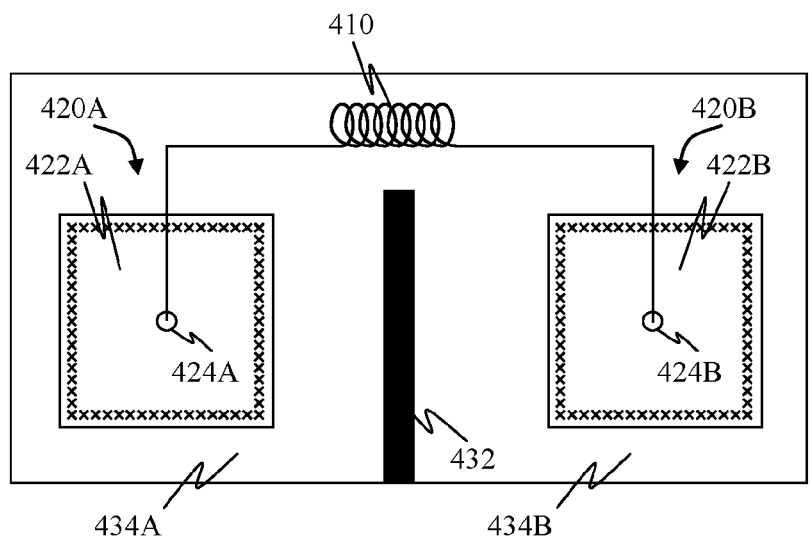

Reference is now made to the isometric representation of FIG. 4A and the top view of FIG. 4B, which schematically represent a particular example of a pair of capacitance arrays 420A, 420B connected to a common current shaping ground plane 430.

Each capacitance array branch of the example includes a terminal plate 422A, 422B connected to the functional circuit 410 at its center point. The terminal plate 422A, 422B is connected to a grounding zone 434A, 434B of the common ground plane 430 via an array of 64 switchable capacitor arranged around its perimeter. It will be appreciated that where each switchable capacitor has the same capacitance C, the capacitor array itself may be used to select a total capacitance of any value up to 64 C in steps of C by switching the required number of capacitors.

It is noted that where equal capacitances are used, and each is at a common difference from the connecting point in the center 424A, 424B of the terminal plate, the impedance of each switchable capacitor should be equal.

Alternatively, the various switchable capacitors may have different capacitors for example one of the capacitors may have a capacitance of C/2 such that 128 values of capacitance up to 63.5 C may be selected in steps of C/2. It will be appreciated that other by providing certain capacitors with other fractional values may provide still smaller steps as required. Furthermore, smaller capacitors may allow FET switches having smaller sizes to be used. As required central control may be provided to subsets of capacitors.

Another feature of this embodiment is that the common current shaping ground plane has a slot 432 therethrough dividing the grounding zone 434A of the first array 420A with the grounding zone 434B of the second array 420B, thus current flow therebetween is limited such that the return path between the closest capacitors is equal to the return path between the furthest capacitors.

Although the array described herein consists of an array of capacitance branches arranged around the perimeter of a rectangle, it will be appreciated that other configurations may be preferred as required. For example, circular arrays, spiral arrays, checkerboard arrays, hexagonal arrays, fractal arrays may be implemented as suit requirements.

Typically, current forming holes are cut into the metal of the ground plane. The current forming holes provide the current shaping zones within the ground plane which direct and shape the return current between each array branch to the bias terminal.

Such current shaping zones may be additionally or alternatively formed by using a ground plane of varying thickness or varying materials. For example, insulating or semi-conducting materials may be introduced into the ground plane to generate the required resistance map.

Furthermore, by connecting the ground plane to the bias voltage via a bias terminal located at its geometric center common-mode ground noise may be reduced. Further noise reduction mechanisms such as chokes may be further included.

Other aspects of the present disclosure relate to systems and methods for providing an isolating mechanism for reducing crosstalk between crossing signal lines. In particular the disclosure relates to an isolation mechanism introducing a current forming element between the signal carrying lines.

It has been found that although crosstalk may be reduced when a conducting shield is introduced between crossing signal wires, significant capacitive coupling occurs between the two signal carrying wires. Surprisingly, this capacitive coupling sets a limiting threshold to the extent that crosstalk between the signal lines may be reduced. It has been found that the amount of crosstalk increases with the frequency of the signal.

It is suggested that crosstalk between the signal lines may be reduced by introducing inductive coupling between the signal lines so as to balance the capacitive coupling such that they cancel each other out. Accordingly, an isolation mechanism may include current forming elements which set up required currents within the conducting shield such that the reactive component of the inductive coupling cancels the reactive component of the capacitive coupling.

For example, current directing elements such as shaped holes, insulators, semiconductors or the like may be introduced into the conducting shield between the crossing transmission lines. It is noted that shaped holes cut through the metal shield have been found to be particularly effective. This may force the current within the conducting shield to flow around the holes in such as a way that the introduced inductive coupling balances the capacitive coupling reducing crosstalk between the signals.

In particular, it has been surprisingly found that diagonal holes of appropriate direction, shape and dimensions through the conducting shield make a significant improvement in the isolation between transmission and reception transition lines in certain systems. It has further been found that the dimensions of the hole through the conducting shield may be selected to isolate the signal coupling in a preferred direction.

As suit requirements, shapes for the holes may be selected from a group including ellipses, rectangles, triangles, dumbbells, or the like as well as combinations thereof. Accordingly, the dimensions of the hole may be determined by suitable selection of defining parameters such as inclination angle, length, width, depth, eccentricity, function of curvature or the like. It is noted that the method may be implemented in both single end and differential structures and may provide a solution to the crosstalk without adding to overall chip area or complexity. Indeed it may be achieved by reducing material from the conducting shield.

Figure 5A:
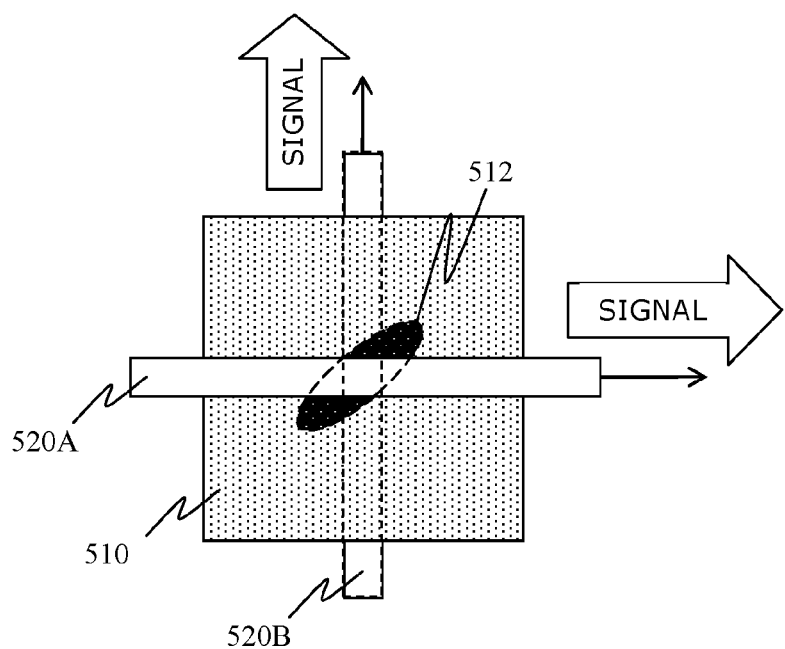
FIG. 5A is a top view schematically representing an isolation mechanism introduced between two crossing single ended signal lines according to the current disclosure.
Figure 5B:
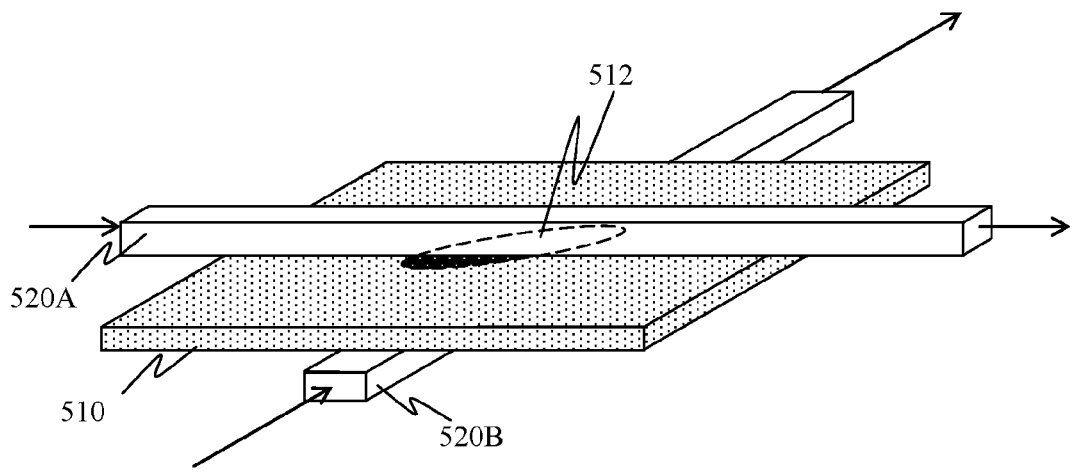
FIG. 5B is an isometric view schematically representing an isolation mechanism introduced between two crossing single ended signal lines according to the current disclosure.

Reference is now made to FIGS. 5A and 5B which respectively show a top view and an isometric view schematically representing an isolation mechanism 500 according to the disclosure introduced between two crossing single ended signal lines 520A, 520B.

The signal isolation mechanism for reducing crosstalk between at least two crossing signal lines. The system includes a conducting shield 510 a first signal line 520A, a second signal line 520B.

The conducting shield 510 of the example is an extended conducting plate having a first side (the upperside, say) and a second side (the underside, say). The first signal line 520A runs parallel to the upperside side of the conducting shield in a first direction. The second signal line 520B runs parallel to the underside of the conducting shield 510 in a second direction not parallel to the first direction. Accordingly, the second signal line 520B crosses the first signal line 520A.

It is a particular feature of the disclosure that the conducting shield 510 includes at least one current directing element 512 selected such that inductive coupling generated between the first signal line and the second signal line cancels the capacitive coupling therebetween.

The current forming element may be a hole 512 extending from the first side to the second side of the conductor. It has been found that signal isolation may be improved by locating the hole through the conducting shield at the point where the two signals cross along a line extending through the shield from the first signal line to the second signal line.

The through-hole 512 may be shaped such that inductive coupling generated between the first signal line 520A and the second signal line 520B cancels capacitive coupling therebetween. Where appropriate the through-hole 512 is diagonally elongated at an angle to both the first signal line 520A and the second signal line 520B.

Referring now to FIGS. 6A, 6B and 6C a top view, an isometric view and an exploded isometric view are shown schematically representing an isolation mechanism 610 introduced between two crossing differential signal lines 620A, 62B according to the current disclosure.

The first differential signal line 620A comprises a first differential pair of conductors. The first differential pair may include a PLUS-line conductor and a MINUS-line conductor.

Similarly, the second differential signal 620B line comprises a second differential pair of conductors. The second differential pair may include a PLUS-line conductor and a MINUS-line conductor.

Accordingly, the signal isolation mechanism 610 may have a first through hole 612A located along a line through the conducting shield extending from a PLUS-line conductor of the first signal line to a PLUS-line conductor of the second signal line at the point at which they cross.

Further the signal isolation mechanism may have a second through hole 612B located along a line through the conducting shield extending from a PLUS-line conductor of the first signal line to a MINUS-line conductor of the second signal line at the point at which they cross.

Moreover, the signal isolation mechanism may have a third through hole 612C located along a line through the conducting shield extending from a MINUS-line conductor of the first signal line to a PLUS-line conductor of the second signal line at the point at which they cross.

The signal isolation mechanism may also have a fourth through hole 612D located along a line through the conducting shield extending from a MINUS-line conductor of the first signal line to a MINUS-line conductor of the second signal line at the point at which they cross.

It has been found that couple balancing may be improved by shaping and positioning the through holes such that the first through hole is diagonally elongated at a first angle across both the first signal line and the second signal line, the second through hole is diagonally elongated at a second angle across both the first signal line and the second signal line, the third through hole is diagonally elongated at the second angle; and the fourth through hole is diagonally elongated at the first angle.

Although only through holes are described above, other embodiments may include conductors of varying thicknesses, for example pits or rises may be etched into the conducting shield to shape eddy-currents therewithin. Similarly other current forming elements, such as variously shaped indentations, dimples, insulators, semiconductors or the like may be introduced into the conducting shield as suit requirements.

Figure 7A:
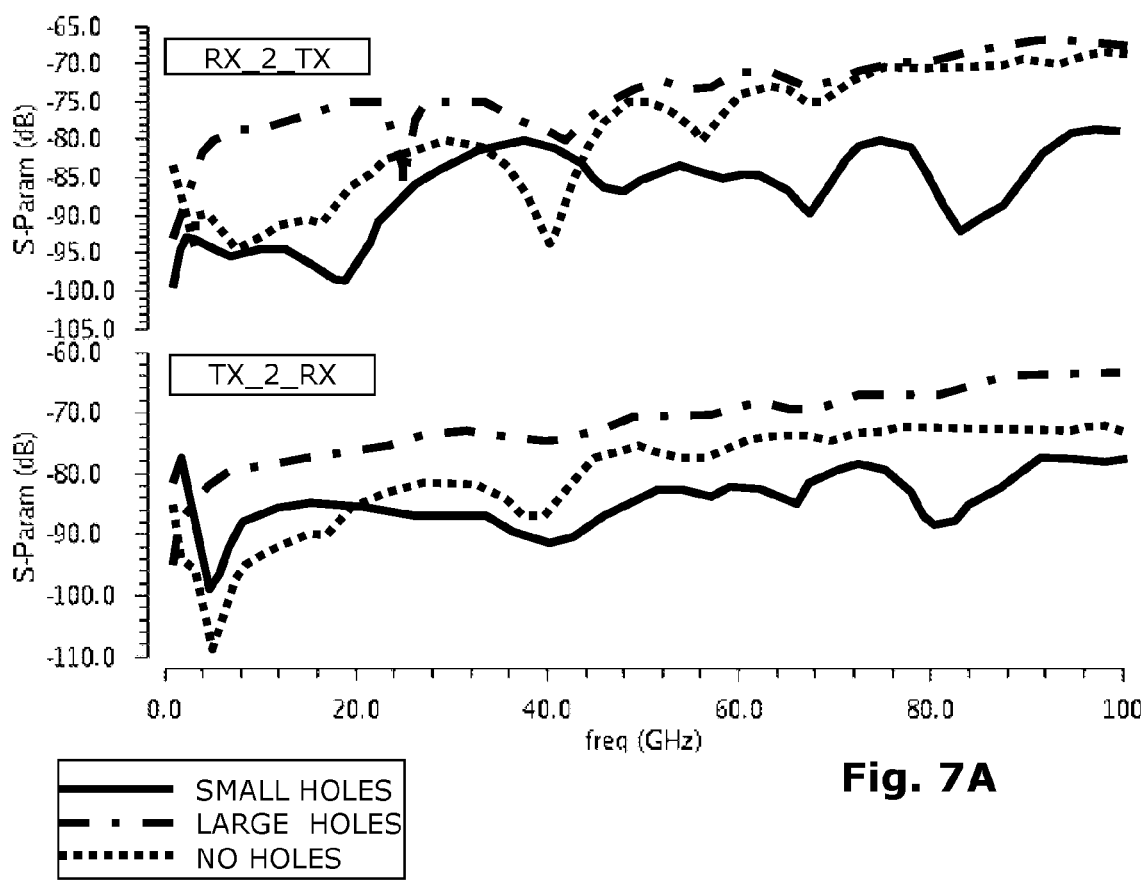
FIGS. 7A and 7B is a graph showing the results of a simulation illustrating how crosstalk may be reduced using various embodiments of the isolation mechanism of the current disclosure.
Figure 7B:
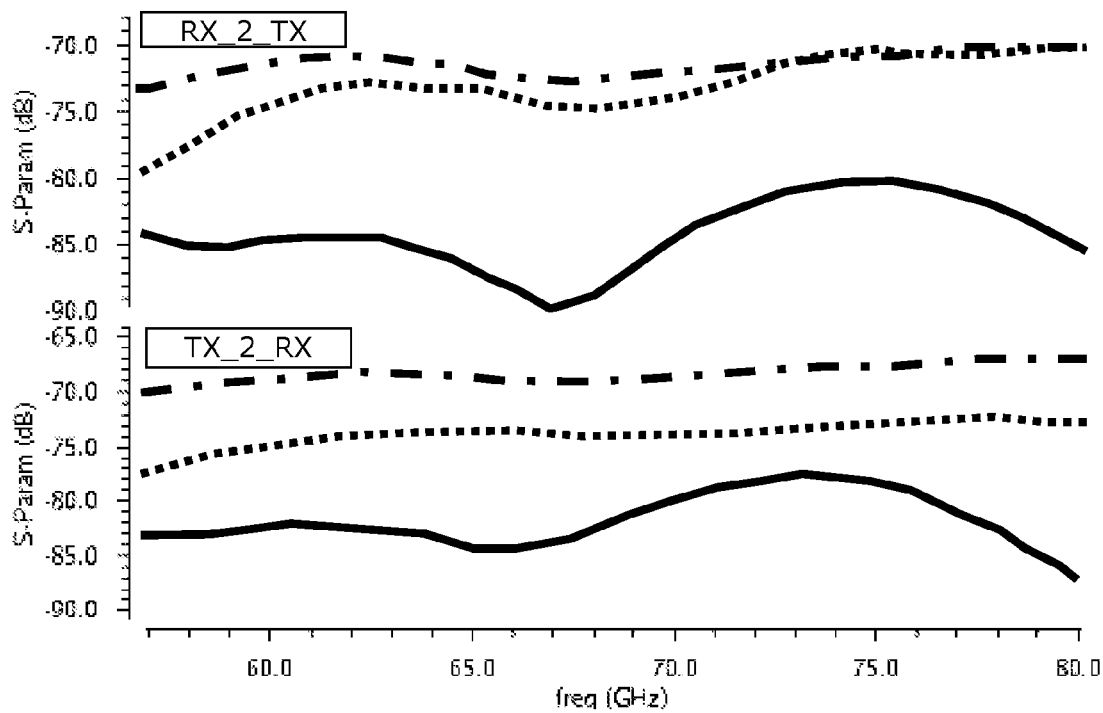

Referring now to the graphs presented in FIGS. 7A and 7B, results are presented of a simulation illustrating how crosstalk may be reduced using various embodiments of the isolation mechanism.

It is noted that performance of various dimensions of the diagonal holes are compared against performance of a conducting shield having no current shaping elements at all. The results indicate that where the holes are sufficiently large cross talk is reduced significantly particularly at signal frequencies in the region of about 50-90 GHz.

It is further noted that where required, hole dimensions and shapes may be optimized for particular frequency ranges.

This disclosure further discloses possible array topologies for combining antennas having directivity-levels into a Multiple Input Multiple Output (MIMO) array. MIMO arrays are useful and well known concepts to utilize efficiently high-resolution beam-pattern (either by pure digital beamforming or a combination of analog and digital beamsteering).

Figure 8A:
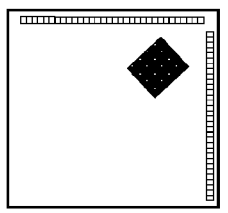
FIG. 8A-C illustrate various topologies for the arrangement of antennas in Multiple Input Multiple Output (MIMO) arrays.
Figure 8B:
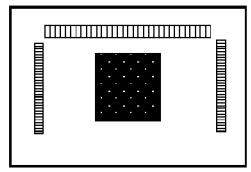
Figure 8C:
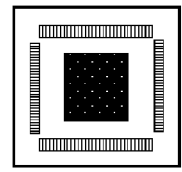

Referring to FIGS. 8A-C, some array topologies include an L-shape array 800A, a Pi-shape 800B and a frame-array 800C. Such topologies may limit the possible attainable system-tradeoffs (such as angular resolution, field-of-view and signal to noise ratio).

It has surprisingly been found that more efficient utilization of MIMO and beam-formed arrays may be produced by combining L-shape and Pi-shape array topologies using antennas of different directivity-values. Such a novel array topology may use a combination of non-directional (wide-beam) and directional antennas over different edges of the array, permitting enhancement of the array performance, for example over selected sectors of the arena.

Figure 8D:
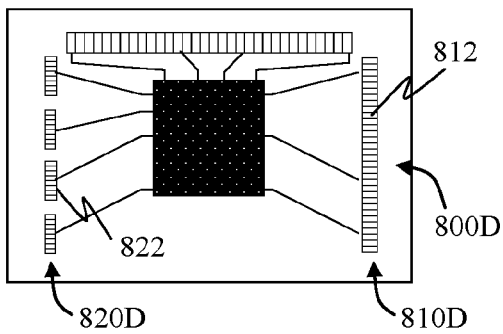
FIG. 8D-F illustrate possible alternative topologies for asymmetric arrangements of antennas in Multiple Input Multiple Output (MIMO) arrays.

Referring now to FIG. 8D, by way of example, one possible embodiment of a combined array is a first asymmetric array 800D. The asymmetric array may be produced by connecting a large number of transmitting ports to wide-beam antennas 812 along a first leg 810D of a Pi-shape array and a smaller number of transmitting ports to directional antennas 822 along a second leg 820D of the Pi-shape array.

Figure 8E:
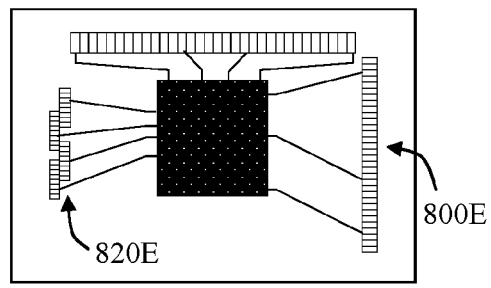
Figure 8F:
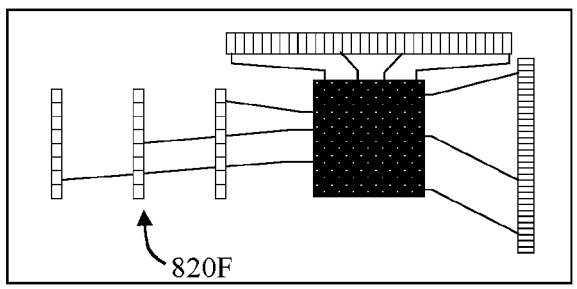
Figure 8G:
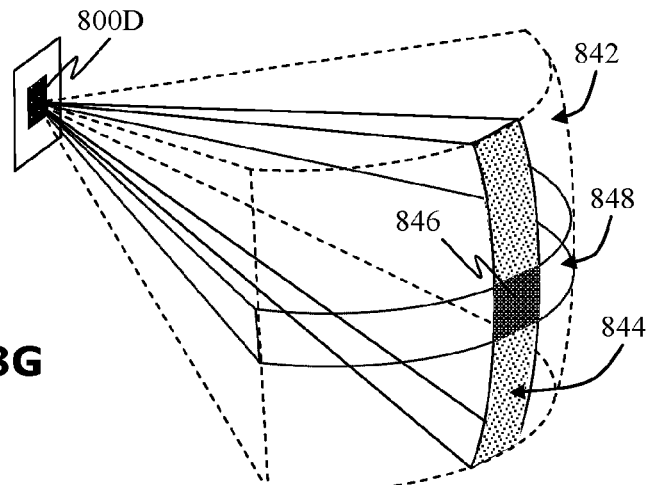
FIG. 8G illustrates the possible field of view of such an asymmetric arrangement.

With reference to FIG. 8G, it is noted that the asymmetric array 800D provide most of the high-SNR (signal to noise ratio) and high angular-resolution on the vertical axis of the L-shape array. This may produce a wide vertical field-of-view 842 and a narrow vertical field-of-view 848 while doubling the horizontal angular-resolution over a narrow slice 844 in the vertical field-of-view. Accordingly, an enhanced horizontal angular resolution is achieved in a central region 846 of the field-of-view The allocation of ports between directional and non-directional antennas can be derived from overall system requirements (SNR and resolution over different angular sectors).

In a non-limiting example, one possible method for obtaining a balanced response from the two asymmetrical branches 810, 820 is by choosing the beamwidth of the directional antennas to be approximately $$\Delta \theta \sim 180° \frac{N_d}{N_{nd}} \eta_1,$$

and antennas-spacing of $$\frac{\lambda}{2} \cdot \frac{N_{nd}}{N_d} \cdot \eta_2,$$

where $N_d$ is the number of directional antennas, and $N_{nd}$ is the number of wide-beam antennas, and $\eta_1$ and $\eta_2$ are realization factors.

Other possible embodiments of assymetric arrays are represented in FIGS. 8E and 8F. With particular reference to FIG. 8E, in a staggered-branch array 800E the directional-antennas may be staggered over the vertical-axis. Such an arrangement may extend the field-of-view of the staggered branch 820E (grating-lobes rejection).

With particular reference to FIG. 8F, in a horizontally-extended array 800F highly-directional antennas 820F may be extended over the horizontal axis for further enhancement of the horizontal-resolution.

Although only asymmetrical arrays of transmitters is illustrated here, it will be appreciated that still other embodiments may include similarly modified arrays of receiving antennas.

In addition, the gain and directivity of the receiving antennas and the transmitting antennas may be different, and adjusted to optimize system-performance. For example—in the first asymmetric array, slightly-directional antennas may be implemented for the receiving ports—which directivity is between the directional and the non-directional transmitting antennas—$D_{tx,dn} < D_{rx} < D_{tx,d}$.

A possible transmission-scheme over this topology may variously use a MIMO transmission, or analog-beamforming of the transmitting-antenna, and combine the two transmitting branches either by using time-domain multiplexing (TDM), orthogonal-coding (e.g. Hadamard encoding), frequency-domain multiplexing (FDM, e.g. using different RF frequency per branch) or other methods as required.

Still other aspects of the present disclosure relate to the implementation of magneto-electric antennas implemented with common printed circuit board (PCB) technology. In particular the disclosure relates to providing encapsulated wideband magneto-electric antennas, where the radome is embedded within the antenna design.

Figure 9A:
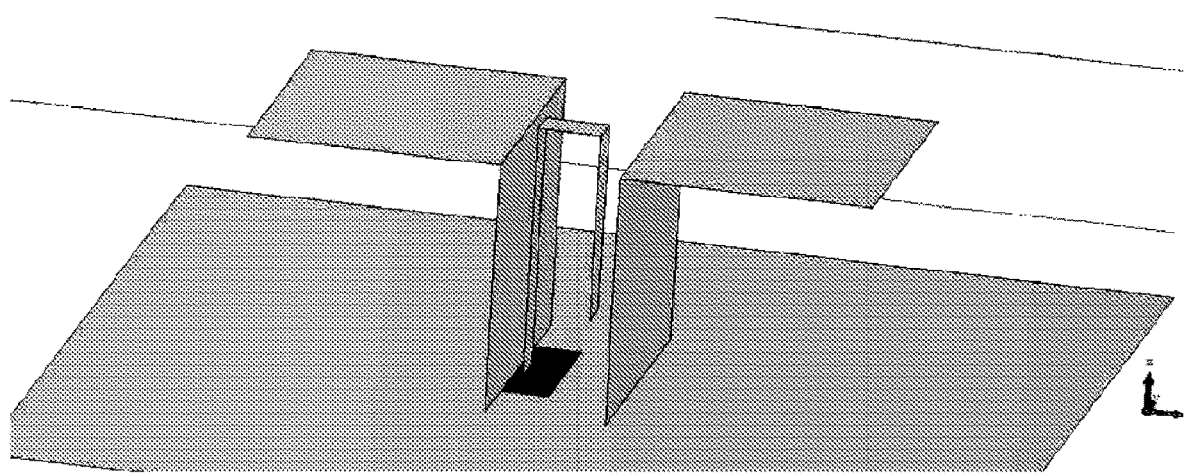
FIG. 9A is a schematic representation of a classical magneto-electric dipole antenna

Reference is now made to FIG. 9A, which is a schematic representation of a magneto-electric dipole antenna which has been found to provide a directional transmission.

The magneto-electric dipole antenna is a hybrid combination of an electric dipole and a magnetic dipole, which has been shown to generate wideband directional radiation patterns in both the E-plane and the H-plane.

The magneto-electric dipole antenna includes an electric dipole section, a magnetic dipole section in the form of a magnetic loop and a feed probe.

The electric dipole section has a first dipole wing section and a second dipole wing section parallel to a ground plane but spaced therefrom by about a half wavelength spacing.

The magnetic dipole section is formed in a region between the first dipole wing section and the second dipole wing section and is thus bounded on three sides by a first vertical patch section and a second vertical patch section and a connecting patch section of said ground plane. The first vertical section connects the ground plane to the first dipole wing section of the electric dipole section and the second vertical section connects the ground plane to the second dipole section.

The feed probe is situated within the region between the first vertical dipole section and the second vertical dipole section. The feed probe is configured and operable to excite the antenna. For example, the feed probe may include a gamma-shaped conductor which may be connected to an oscillator. The gamma-shaped probe may have a leg section, a neck section and a folded section the dimensions of which are selected to suit required resistive and capacitive characteristics of the antenna.

Figure 9B:
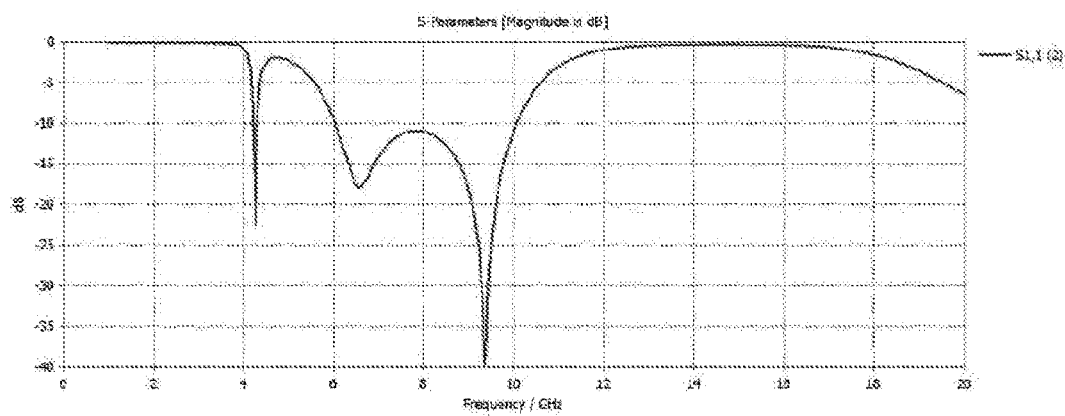
FIG. 9B is a graph showing the simulated reflection coefficient (S11) for the antenna of FIG. 9A showing two reflection zeros within a band of 6 GHz to 10 GHz.

The gain profile for such an antenna is shown in the graph of FIG. 9B which presents the simulated gain profile for such an antenna. It will be noted that the simulated results indicate two resonant reflection zeros within a transmission frequency band of about 6 GHz to 10 GHz.

Figure 10A:
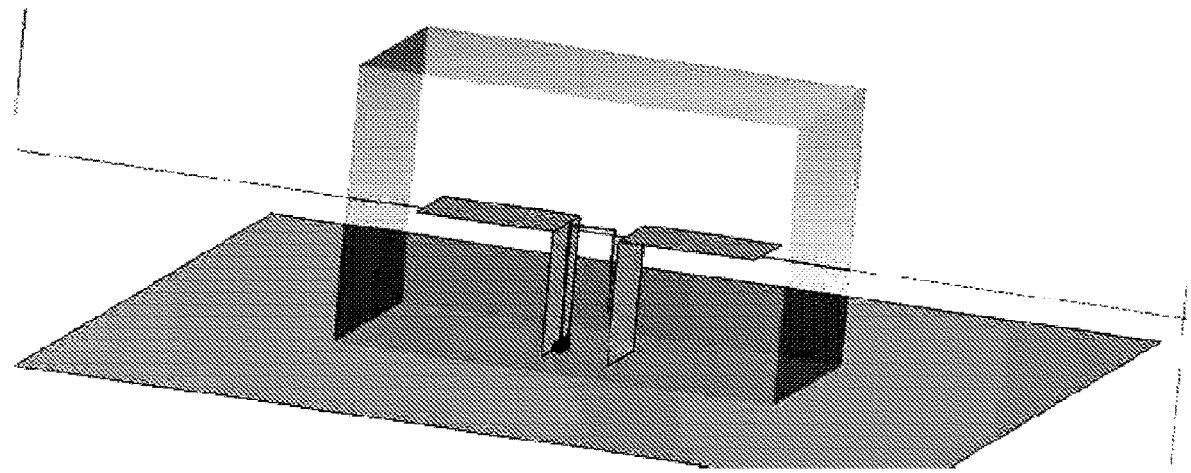
FIG. 10A is a schematic representation of an example of a dielectric encapsulated magneto-electric dipole antenna, having much smaller dimensions due to the dielectric permittivity, which may be used to provide a uni-directional pattern over a wide frequency range.

Referring now to FIG. 10A, a schematic representation is shown of an example of an encapsulated magneto-electric dipole antenna which may be used to provide a directional radiation over a wide band of operating frequencies.

The wideband antenna comprises a magneto-electric dipole including an electric dipole, a magnetic dipole antenna, and a feed probe, all encapsulated inside within a dielectric enclosure. The dielectric enclosure may be constructed from a glass epoxy material, for example a glass epoxy laminate such as G-10, G-11, FR-4, FR-5 and FR-6 or the like. The enclosure may be also constructed from magnetic materials having relative magnetic permeability higher than 1.

It is noted that the higher the relative permittivity Er of a dielectric material, the lower the speed of electromagnetic waves passing therethrough. Accordingly, the wavelength of electromagnetic waves of a given frequency is reduced according to the relative permittivity Er. Indeed the wavelength decrease according to the square root of the relative permittivity Er.

Accordingly, the mechanical dimensions of the encapsulated a magneto-electric dipole antenna may be significantly smaller than the equivalent air based magneto-electric dipole antenna.

For example, the flame resistant glass epoxy FR-4 has a relative permittivity Er of 3.8-4 so the wavelength of electromagnetic waves of a given frequency passing therethrough is about half the wavelength of the same frequency radiation in air. Therefore, by encasing a magneto-electric dipole in a dielectric enclosure (like FR-4) the physical dimensions of the antenna may be reduced by almost a half. In one example, the dielectric box dimensions may be as small as 18 millimeters×10 millimeters×11 millimeters. Such a small magneto-electric dipole may readily be mounted and stacked upon a PCB for example. At higher frequencies, having shorter wavelength, magneto-electric dipole antennas are suitable for embedding into the PCB or an RFIC package.

Figure 10B:
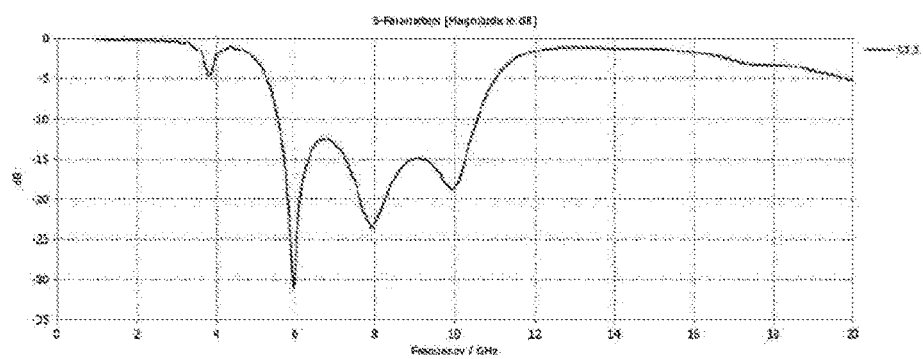
FIG. 10B is a graph showing the simulated reflection coefficient (S11) for the antenna of FIG. 2A showing three reflection zeros within a band of 5.5 GHz to 11 GHz.
Figure 10C:
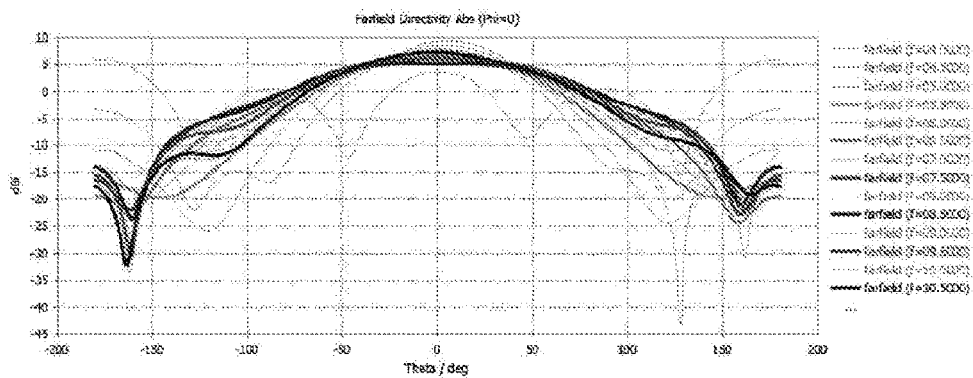
FIG. 10C is a graph showing the directivity of the antenna of FIG. 2A in the E-Plane, at various frequencies.

Referring now to the graph of FIG. 10B the simulated reflection coefficient over frequency is shown for the antenna of FIG. 10A. It is noted that, surprisingly, whereas the air based magneto-electric dipole had only two resonant zeros (see FIG. 9B), the dielectric embedded magneto-electric dipole displays three distinct zeros within an extended transmission band of 5.5 GHz to 11 GHz. The additional resonant zero may be a result of the dielectric enclosure serving as a resonant chamber surrounding the antenna formed of dielectric material having a relative permittivity higher than air.

The graph of FIG. 10O shows how the E-Plane radiation pattern of the antenna of FIG. 10A as a function of frequency between 4 and 10.5 GHz. The patterns are very stable over frequency in both the E and H planes.

Figure 11:
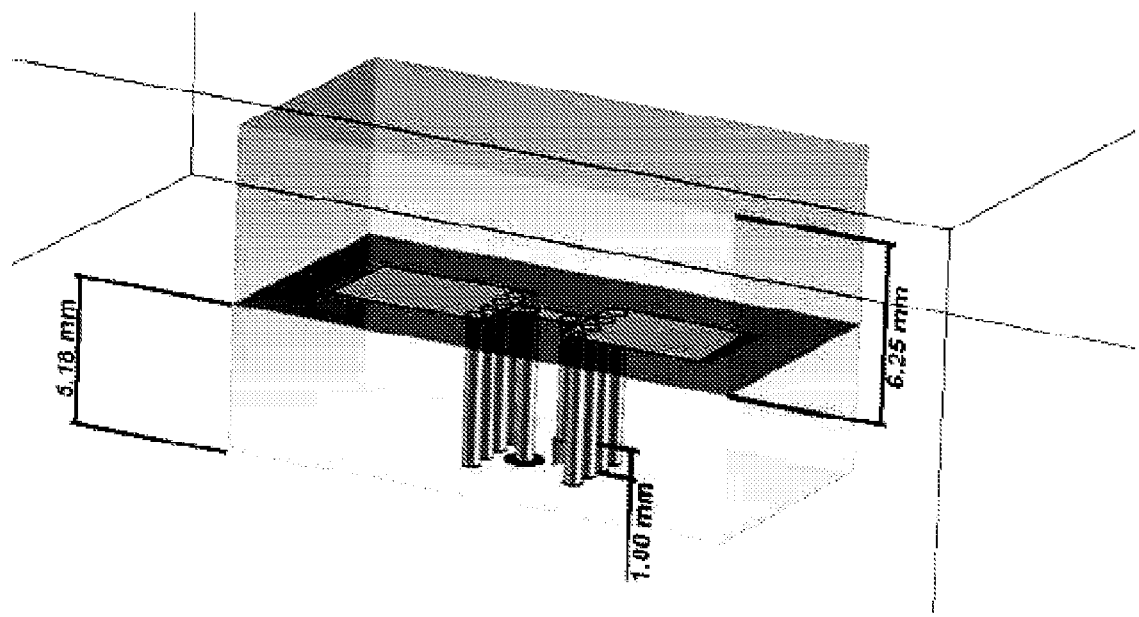
FIG. 11 is a schematic illustration of another possible encapsulated magneto-electric dipole antenna implemented using common PCB manufacturing technology.

Reference is now made to FIG. 11 which illustrates another possible encapsulated magneto-electric dipole antenna designed to be manufactured by standard PCB production processes.

The wideband antenna again comprises a magneto-electric dipole including an electric dipole, a magnetic dipole antenna, and a feed probe, all encapsulated inside within a dielectric enclosure.

Here the magnetic dipole part is not a complete sheet of metal as illustrated in the embodiments above but rather the vertical sections of the magnetic dipole antenna are formed from by a row of platted via holes extending from the ground plane to the dipole wing.

The feed probe is a gamma-probe including a leg section, a neck section and a folded section, which is similarly formed from vias. The leg section comprises a via extending from the ground plane to the bridge section, the neck section comprises a conducting strip coplanar with the dipole wings, and the folded section comprises a via extending from the neck section towards the ground plane and separated therefrom by an insulator.

For manufacturing purposes it may be useful to construct the dielectric enclosure in multiple parts which are then joined together. For example, the dielectric enclosure may include a lower section and an upper section. The magneto-electric dipole may be embedded in the lower section and the upper section may comprise a dielectric layer, which is subsequently affixed to cover the lower section. Accordingly, an embedded antenna element maybe provided which is readily affixed to a printed circuit board.

A method is therefore taught for manufacturing a wideband antenna. The method may include the following steps: providing a magneto-electric dipole, by providing a pair of horizontal conducting plates spaced so as to serve as two electric dipole wings but leaving a space suitable for a magnetic dipole therebetween; providing a first row of vias extending from a ground plane to a first electric dipole wing to serve as a first vertical section of a magnetic dipole section of the magneto-electric dipole; providing a second row of vias extending from a ground plane to a first electric dipole wing to serve as a second vertical section of a magnetic dipole section of the magneto-electric dipole, and encapsulating the magneto-electric dipole thus constructed in a dielectric material.

Furthermore the feed probe may be manufactured by providing a conducting strip coplanar with the dipole wings to serve as a neck section of the feed probe; providing a first via extending from the ground plane to the conducting strip section to serve as a leg section of the feed probe; and providing a second via extending from the neck section towards the ground plane and separated therefrom by an insulator to serve as a folded section.

Figure 12A:
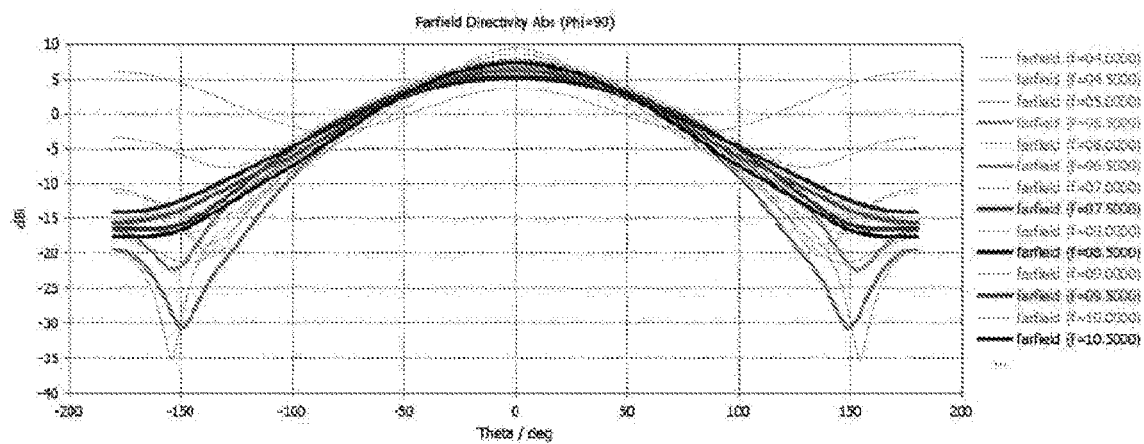
Figure 12B:
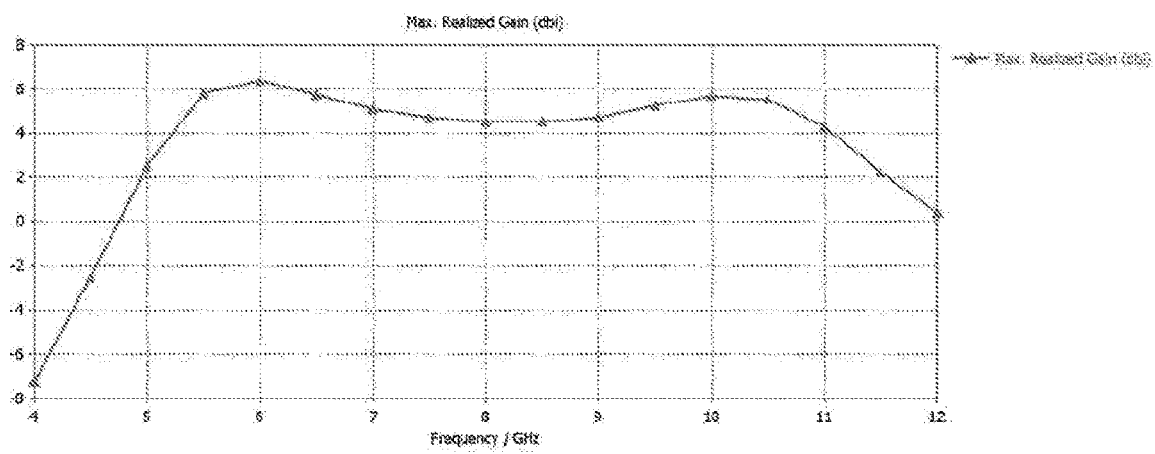

Reference is now made to the graphs of FIGS. 12A and 12B which illustrate simulated values showing how gain of the encapsulated magneto-electric dipole antenna of FIG. 11 varies over space angle and over frequency at normal direction/FIG. 12A shows how the H-Plane gain radiation pattern varies over space angle for frequencies between 4 and 10.5 GHz. FIG. 4B shows how the realized gain of the antenna is stable over frequencies between about 5 GHz to 11 GHz.

Figure 13A:
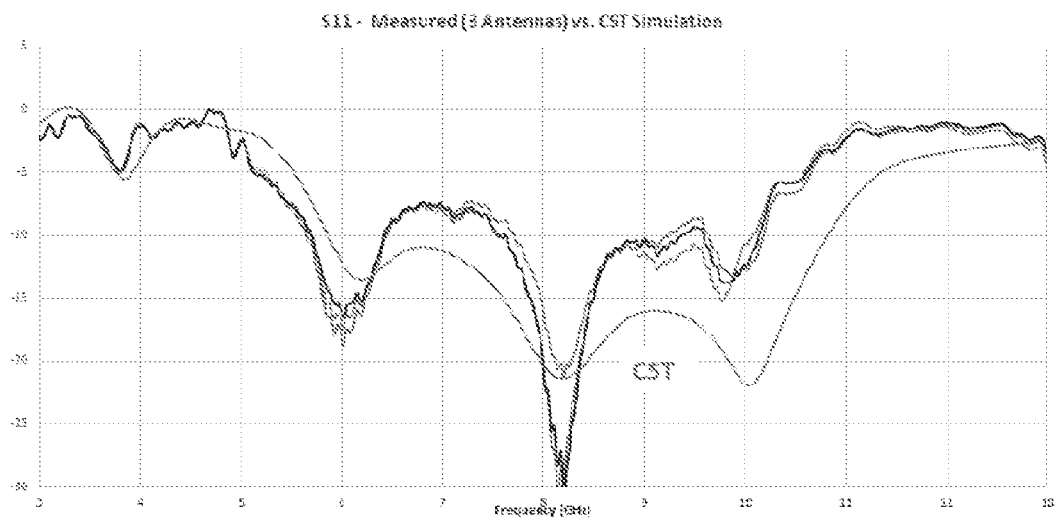
Figure 13B:
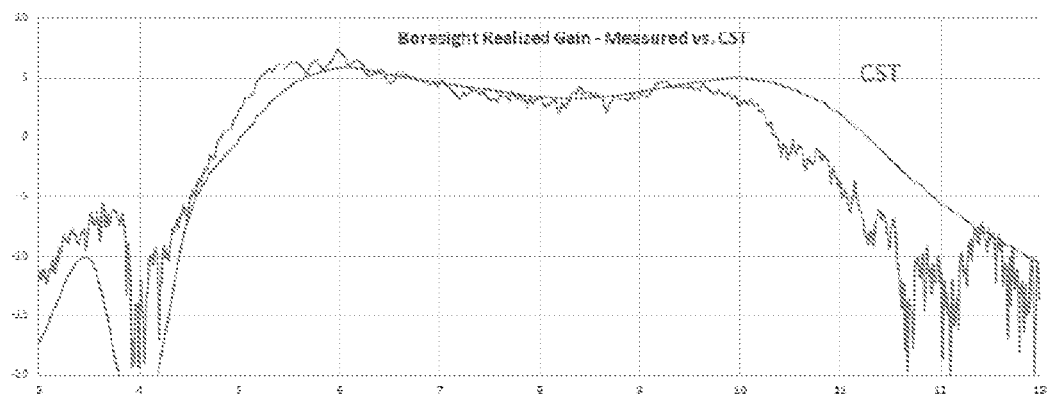

The graphs of FIGS. 13A and 13B illustrate how the simulated results (done using CST Microwave Studio) for the encapsulated magneto-electric dipole antenna of FIG. 11 compare to experimental results for a real encapsulated magneto-electric dipole antenna. It is noted how closely the experimental results follow the expected simulation results.

Figure 14A:
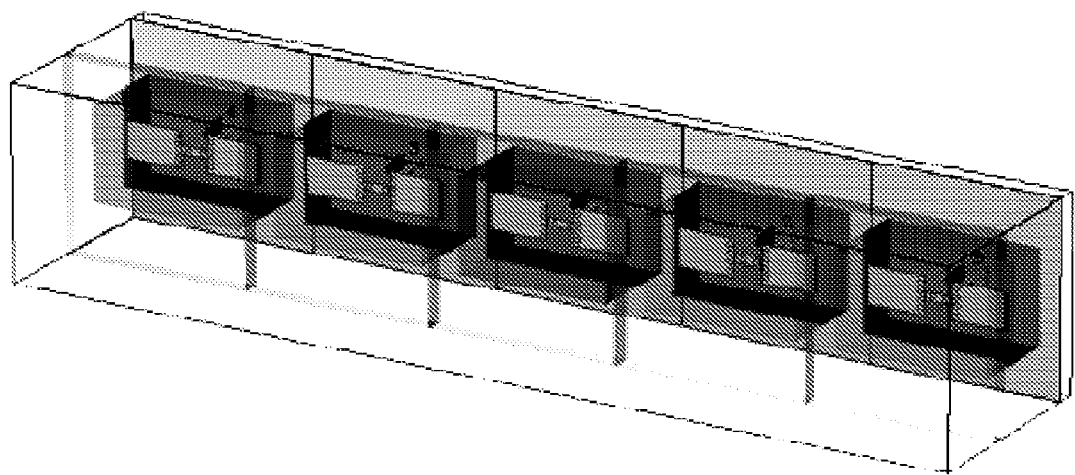
FIG. 14A is a schematic representation of an E-Plane antenna array comprising a row of encapsulated magneto-electric dipole antenna arranged along a line parallel to their electric dipoles and sharing a common encapsulating radome cover.

Referring now to FIG. 14A, a schematic representation is shown of an E-Plane antenna array. A row of encapsulated magneto-electric dipole antennas are arranged along a line parallel to their electric dipoles. FIG. 14A is a schematic E-Plane cross section representation of the magneto-electric antenna array.

It is particularly noted that all the antennas along the array share a common encapsulating radome cover. Accordingly, each antenna may be embedded in an individual dielectric lower section, and a common dielectric radome cover caps all antenna of the array, thereby forming an encapsulated array.

Such an array may be manufactured by a method including providing a plurality of magneto-electric dipole antennas, embedding each of the magneto-electric dipole antennas in a dielectric rectangular cuboid, providing a common dielectric radome layer, for all magneto-electric dipole antennas, mounting the embedded magneto-electric dipoles in an array upon a printed circuit board; and covering the array of embedded magneto-electric dipoles with the common dielectric radome layer.

Figure 15A:
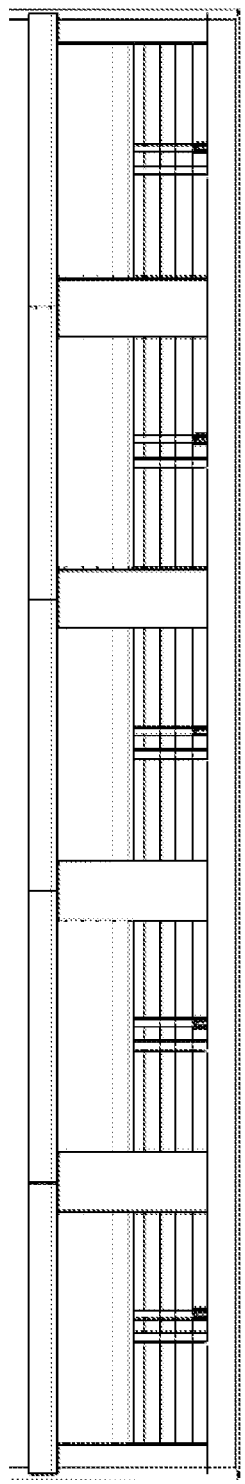
FIG. 15A is a schematic E-Plane cross section representation of an antenna array comprising a row of encapsulated magneto-electric dipole antenna arranged along a line parallel to their electric dipoles and sharing a common encapsulating radome cover.
Figure 15B:
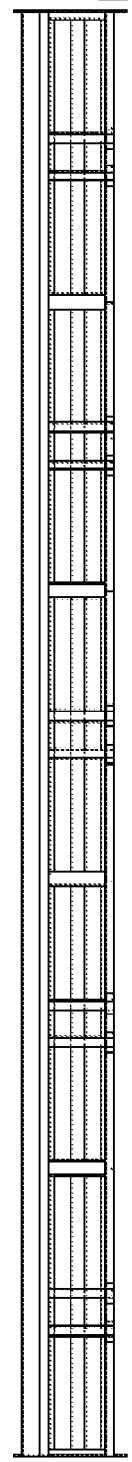
FIG. 15B is a schematic E-Plane cross section representation of an antenna array comprising a row of standard electric-dipole antenna arranged along a line parallel to their electric dipoles.

By way of comparison, FIG. 15A shows a schematic representation of an E-Plane antenna array comprising a row of standard electric-dipole antenna arranged along a line parallel to their electric dipoles. FIG. 15B is a schematic E-Plane cross section representation of the electric-dipole antenna array.

Figure 14B:
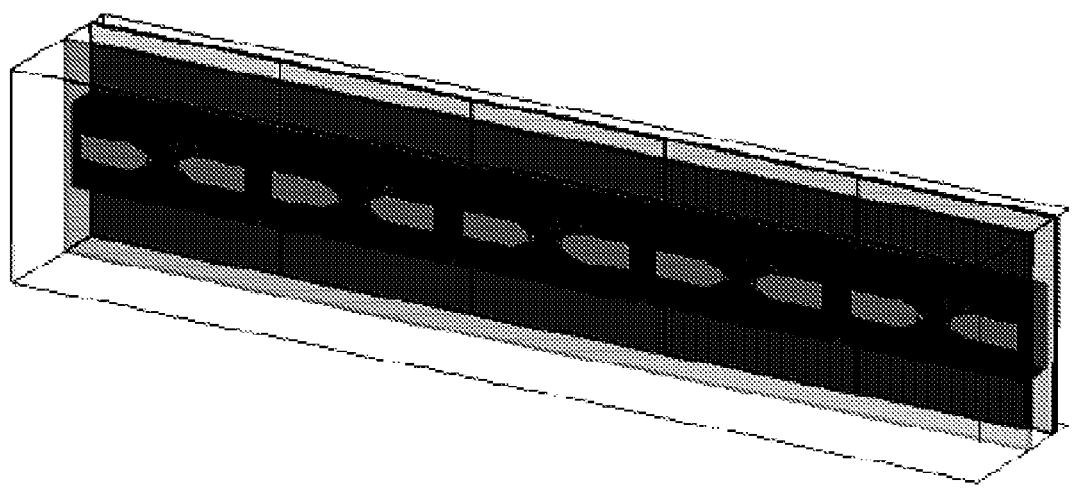
FIG. 14B is a schematic representation of an E-Plane antenna array comprising a row of standard electric-dipole antenna arranged along a line parallel to their electric dipoles.
Figure 16A:
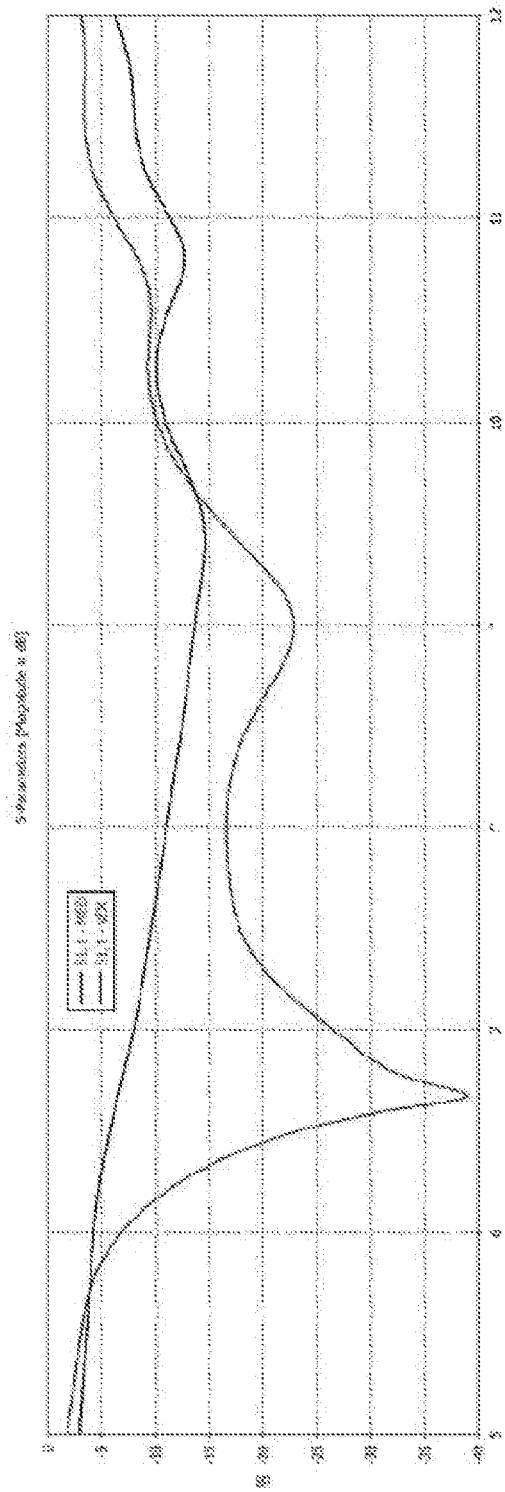
FIGS. 16A and 16B are graphs comparing the reflection coefficient (S11) and realized gain over frequency for the E-Plane magneto electric antenna array of FIGS. 14A and 15A versus the E-Plane electric dipole antenna array of FIGS. 14B and 15B.
Figure 16B:
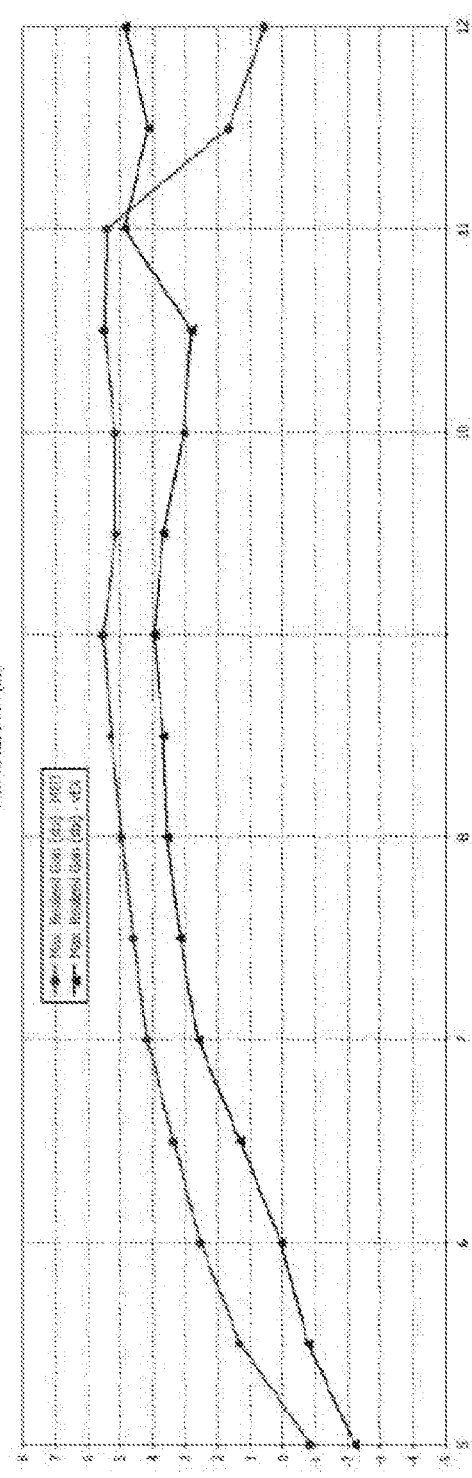

Computer simulated models were created for both of these arrays. The behavior is presented in the graphs of FIGS. 16A and 16B which compare the reflection coefficient and realized gain over wide frequency range for the E-Plane magneto electric antenna array of FIGS. 14A and 15A having a radome layer with a relative permittivity of 3 and a thickness of 2 millimeters, and the E-Plane electric dipole antenna array of FIGS. 14B and 15B.

Figure 17A:
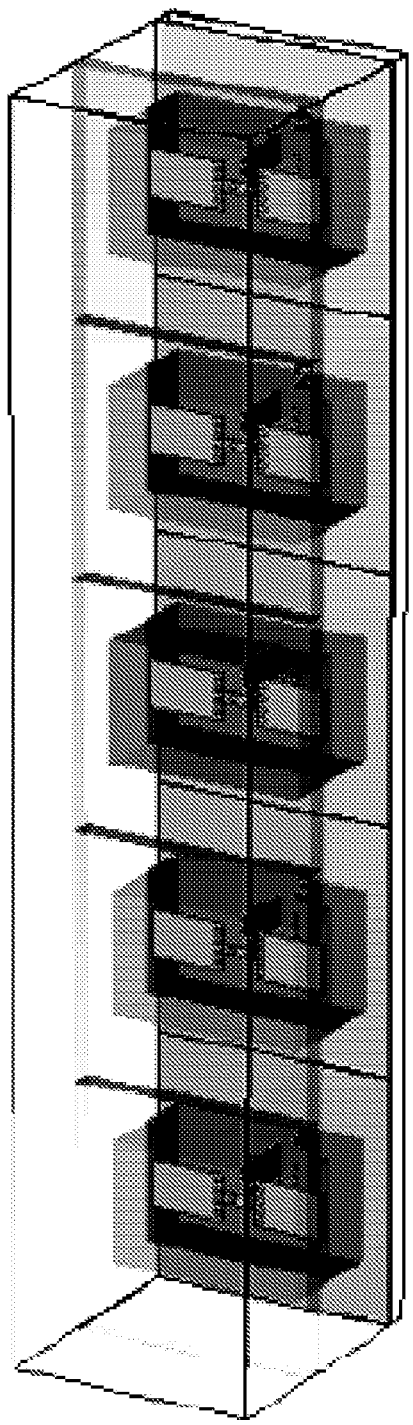
FIG. 17A is a schematic representation of an H-Plane antenna array comprising a row of encapsulated magneto-electric dipole antenna arranged along a line orthogonal to their electric dipoles and sharing a common encapsulating radome cap.
Figure 17D:
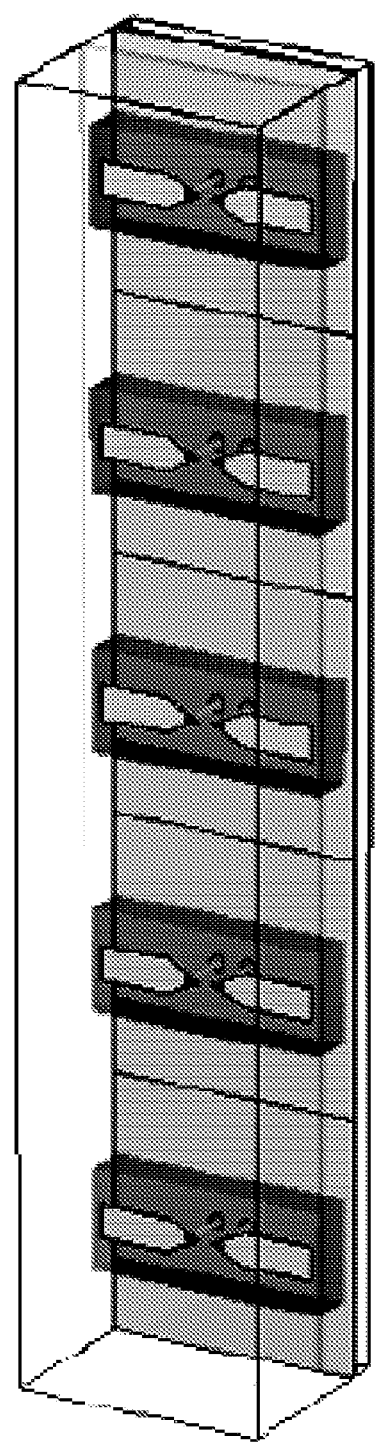
FIG. 17B is a schematic representation of an H-Plane antenna array comprising a row of standard electric-dipole antenna arranged along a line orthogonal to their electric dipoles.

Further computer simulated models were created for H-Plane antenna arrays such as shown in FIGS. 17A and 17B.

FIG. 17A is a schematic representation of an H-Plane antenna array comprising a row of encapsulated magneto-electric dipole antenna arranged along a line orthogonal to their electric dipoles and sharing a common encapsulating radome cap;

For comparison, FIG. 17B is a schematic representation of an H-Plane antenna array comprising a row of standard electric-dipole antenna arranged along a line orthogonal to their electric dipoles.

Figure 18A:
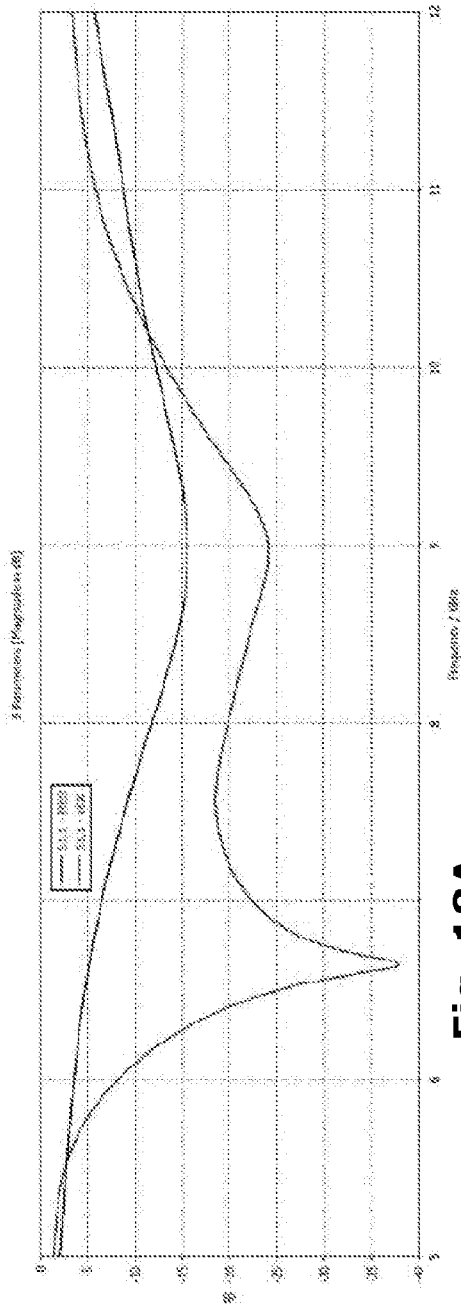
FIGS. 18A and 18B are graphs comparing the reflection coefficient (S11) and realized gain over frequency for the H-Plane magneto electric antenna array of FIG. 14A versus the H-Plane electric dipole antenna array of FIG. 15B.
Figure 18B:
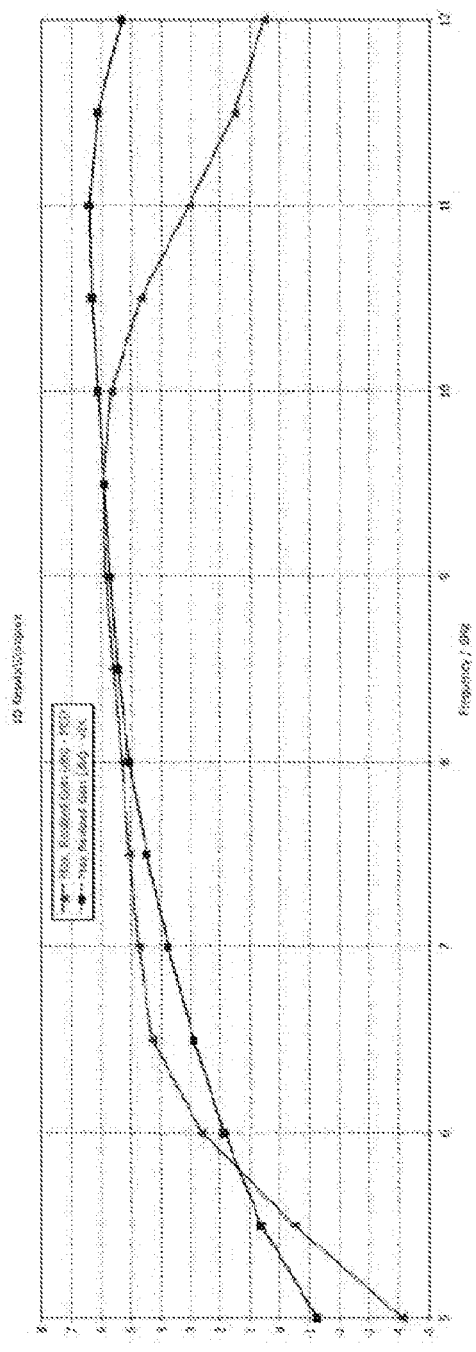

The behavior of the simulated H-Plane antenna arrays is presented in the graphs of FIGS. 18A and 18B are graphs comparing the reflection coefficient and realized gain over wide frequency range for the H-Plane magneto electric antenna array of FIG. 17A having a radome layer with a relative permittivity of 3 and a thickness of 2 millimeters, and the H-Plane electric dipole antenna array of FIG. 17B.

TECHNICAL NOTES

Technical and scientific terms used herein should have the same meaning as commonly understood by one of ordinary skill in the art to which the disclosure pertains. Nevertheless, it is expected that during the life of a patent maturing from this application many relevant systems and methods will be developed. Accordingly, the scope of the terms such as computing unit, network, display, memory, server and the like are intended to include all such new technologies a priori.

As used herein the term "about" refers to at least ±10%.

The terms "comprises", "comprising", "includes", "including", "having" and their conjugates mean "including but not limited to" and indicate that the components listed are included, but not generally to the exclusion of other components. Such terms encompass the terms "consisting of" and "consisting essentially of".

The phrase "consisting essentially of" means that the composition or method may include additional ingredients and/or steps, but only if the additional ingredients and/or steps do not materially alter the basic and novel characteristics of the claimed composition or method.

As used herein, the singular form "a", "an" and "the" may include plural references unless the context clearly dictates otherwise. For example, the term "a compound" or "at least one compound" may include a plurality of compounds, including mixtures thereof.

The word "exemplary" is used herein to mean "serving as an example, instance or illustration". Any embodiment described as "exemplary" is not necessarily to be construed as preferred or advantageous over other embodiments or to exclude the incorporation of features from other embodiments.

The word "optionally" is used herein to mean "is provided in some embodiments and not provided in other embodiments". Any particular embodiment of the disclosure may include a plurality of "optional" features unless such features conflict.

Whenever a numerical range is indicated herein, it is meant to include any cited numeral (fractional or integral) within the indicated range. The phrases "ranging/ranges between" a first indicate number and a second indicate number and "ranging/ranges from" a first indicate number "to" a second indicate number are used herein interchangeably and are meant to include the first and second indicated numbers and all the fractional and integral numerals therebetween. It should be understood, therefore, that the description in range format is merely for convenience and brevity and should not be construed as an inflexible limitation on the scope of the disclosure. Accordingly, the description of a range should be considered to have specifically disclosed all the possible sub-ranges as well as individual numerical values within that range. For example, description of a range such as from 1 to 6 should be considered to have specifically disclosed sub-ranges such as from 1 to 3, from 1 to 4, from 1 to 5, from 2 to 4, from 2 to 6, from 3 to 6 etc., as well as individual numbers within that range, for example, 1, 2, 3, 4, 5, and 6 as well as non-integral intermediate values. This applies regardless of the breadth of the range.

It is appreciated that certain features of the disclosure, which are, for clarity, described in the context of separate embodiments, may also be provided in combination in a single embodiment. Conversely, various features of the disclosure, which are, for brevity, described in the context of a single embodiment, may also be provided separately or in any suitable sub-combination or as suitable in any other described embodiment of the disclosure. Certain features described in the context of various embodiments are not to be considered essential features of those embodiments unless the embodiment is inoperative without those elements.

Although the disclosure has been described in conjunction with specific embodiments thereof, it is evident that many alternatives, modifications and variations will be apparent to those skilled in the art. Accordingly, it is intended to embrace all such alternatives, modifications and variations that fall within the spirit and broad scope of the appended claims.

All publications, patents and patent applications mentioned in this specification are herein incorporated in their entirety by reference into the specification, to the same extent as if each individual publication, patent or patent application was specifically and individually indicated to be incorporated herein by reference. In addition, citation or identification of any reference in this application shall not be construed as an admission that such reference is available as prior art to the present disclosure. To the extent that section headings are used, they should not be construed as necessarily limiting.

The scope of the disclosed subject matter is defined by the appended claims and includes both combinations and sub combinations of the various features described hereinabove as well as variations and modifications thereof, which would occur to persons skilled in the art upon reading the foregoing description.

The invention claimed is:

1. An array of switched capacitors comprising:
   a plurality of capacitors upon a substrate, said capacitors arranged into a plurality of capacitor array branches, each capacitor array branch having a characteristic capacitance; and
   a plurality of electronic switches for selectively connecting each capacitor array branch to a common functional circuit terminal junction, wherein each said capacitor array branch is conductively coupled to an extended conducting ground plane, and
wherein said ground plane comprises at least one current limiting element located such that return current from each said capacitor array branch to the functional circuit terminal junction is equalized.

2. The array of switched capacitors of claim 1 wherein said at least one current limiting element comprises a plurality of holes through said ground plane.

3. The array of switched capacitors of claim 1 wherein said at least one current limiting element comprises a semiconducting material.

4. The array of switched capacitors of claim 1 wherein said at least one current limiting element comprises an insulating material.

* * * * *